United States Patent
Kim et al.

(10) Patent No.: US 9,601,494 B2
(45) Date of Patent: Mar. 21, 2017

(54) SEMICONDUCTOR DEVICES HAVING A SUPPORTER AND METHODS OF FABRICATING THE SAME

(71) Applicant: Samsung Electronics Co., Ltd., Suwon-si, Gyeonggi-do (KR)

(72) Inventors: Kyung-Eun Kim, Seoul (KR); Dae-Ik Kim, Hwaseong-si (KR); Seung-Jun Lee, Bucheon-si (KR); Young-Seung Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 15 days.

(21) Appl. No.: 14/636,397

(22) Filed: Mar. 3, 2015

(65) Prior Publication Data

US 2016/0049460 A1    Feb. 18, 2016

(30) Foreign Application Priority Data

Aug. 12, 2014    (KR) .................. 10-2014-0104439

(51) Int. Cl.
*H01L 27/108*    (2006.01)
*H01L 49/02*    (2006.01)

(52) U.S. Cl.
CPC .. *H01L 27/10814* (2013.01); *H01L 27/10852* (2013.01); *H01L 28/90* (2013.01)

(58) Field of Classification Search
CPC ................... H01L 27/10817; H01L 28/90
USPC ......................... 257/309, 306, 311
See application file for complete search history.

(56) References Cited

U.S. PATENT DOCUMENTS

| 2004/0266126 A1* | 12/2004 | Lee ..................... H01L 28/75 438/396 |
| 2006/0046380 A1* | 3/2006 | Choi ................. H01L 27/10852 438/238 |
| 2009/0121315 A1* | 5/2009 | Baars ................... H01L 28/90 257/532 |
| 2009/0294907 A1* | 12/2009 | Tegen .................. H01L 28/90 257/535 |
| 2013/0161715 A1 | 6/2013 | Nagai |
| 2013/0250477 A1 | 9/2013 | Lim |
| 2013/0285199 A1 | 10/2013 | Nagai |

FOREIGN PATENT DOCUMENTS

| KR | 1020090016810 A | 2/2009 |
| KR | 1020090037257 A | 4/2009 |
| KR | 1020110078133 A | 7/2011 |
| KR | 1020130107858 A | 10/2013 |

\* cited by examiner

*Primary Examiner* — Jerome Jackson, Jr.
*Assistant Examiner* — John Lin
(74) *Attorney, Agent, or Firm* — Myers Bigel, P.A.

(57) ABSTRACT

Provided are semiconductor devices and methods of fabricating the same. The semiconductor devices include an interlayer insulating layer on a semiconductor substrate, contact pads on the semiconductor substrate and penetrating the interlayer insulating layer, a stopping insulating layer on the interlayer insulating layer, storage electrodes on the contact pads, upper supporters between upper parts of the storage electrodes, side supporters between the storage electrodes and the upper supporters, a capacitor dielectric layer on the storage electrodes, the side supporters, and the upper supporters, and a plate electrode on the capacitor dielectric layer.

20 Claims, 36 Drawing Sheets

SEMICONDUCTOR DEVICES HAVING A SUPPORTER AND METHODS OF FABRICATING THE SAME

CROSS-REFERENCE TO RELATED APPLICATION

This application claims priority under 35 U.S.C. §119 to Korean Patent Application No. 10-2014-0104439, filed on Aug. 12, 2014, the disclosure of which is hereby incorporated by reference in its entirety.

BACKGROUND

Embodiments of the present inventive concepts relate to semiconductor devices having a supporter and methods of fabricating the same.

As the degree of integration of semiconductor devices has been increased, the sizes of holes, plugs, contacts, and capacitors have been reduced, and intervals between patterns are becoming very small. Because a vertical height of a lower electrode of a capacitor can be very high, formation of supporters for supporting the lower electrode of the capacitor has been proposed. However, since an interval is required to form the supporters, the degree of integration of the lower electrodes of the capacitor is limited.

SUMMARY

Embodiments of the present inventive concepts provide semiconductor devices having supporters.

Other embodiments of the present inventive concepts provide methods of forming capacitor structures of semiconductor devices.

Other embodiments of the present inventive concepts provide methods of removing a bridge generated between storage electrodes by reducing horizontal widths of the storage electrode.

Other embodiments of the present inventive concepts provide methods of forming capacitor structures capable of improving an electrical characteristic of semiconductor devices.

In accordance with an aspect of the present inventive concepts, semiconductor devices may include an interlayer insulating layer on a semiconductor substrate, contact pads on the substrate and penetrating the interlayer insulating layer, a stopping insulating layer on the interlayer insulating layer, storage electrodes on the contact pads, upper supporters between upper parts of the storage electrodes, side supporters between the storage electrodes and the upper supporters, a capacitor dielectric layer on the storage electrodes, the side supporters, and the upper supporters, and a plate electrode on the capacitor dielectric layer.

In accordance with an aspect of the present inventive concepts, semiconductor devices may include an interlayer insulating layer on a semiconductor substrate, contact pads on the semiconductor substrate and penetrating the interlayer insulating layer, storage electrodes on the contact pads, a storage barrier layer contacting side surfaces of the storage electrodes, upper supporters between upper parts of the storage electrodes, lower supporters between intermediate parts of the storage electrodes, a capacitor dielectric layer on the storage electrodes and the upper supporters, and a plate electrode on the capacitor dielectric layer. The upper supporters may contact side surfaces of upper parts of the storage electrodes, and the lower supporters contact side surfaces of the storage barrier layer.

In accordance with an aspect of the present inventive concepts, semiconductor devices may include a storage electrode, a plate electrode, wherein the plate electrode comprises an upper plate electrode on the storage electrode and a lower plate electrode adjacent a lower portion of the storage electrode, an insulating supporter between the lower plate electrode and the upper plate electrode in contact with a side surface of the storage electrode, and a conductive storage barrier layer on the storage electrode, wherein a top surface of the storage barrier layer contacts a lower surface of the supporter.

In accordance with an aspect of the present inventive concepts, methods of fabricating semiconductor devices may include forming a molding layer on contact pads, forming a supporter on the molding layer, forming first holes vertically penetrating the supporter and the molding layer to expose surfaces of the contact pads, forming storage barrier layers and storage electrodes in the first holes, partially removing upper parts of the storage barrier layers for forming gaps between the storage electrodes and the supporter, forming a side supporter in the gaps, removing the molding layer, exposing side surfaces of the storage barrier layers, forming a capacitor dielectric layer on the exposed side surfaces of the storage barrier layers, and forming a plate electrode on the capacitor dielectric layer.

Details of other embodiments are included in detailed explanations and the drawings.

BRIEF DESCRIPTION OF THE DRAWINGS

The foregoing and other features and advantages of the present inventive concepts will be apparent from the more particular description of preferred embodiments of the present inventive concepts, as illustrated in the accompanying drawings in which like reference characters refer to the same parts throughout the different views. The drawings are not necessarily to scale, emphasis instead being placed upon illustrating the principles of the present inventive concepts. In the drawings.

DETAILED DESCRIPTION OF THE EMBODIMENTS

Figure 1A:
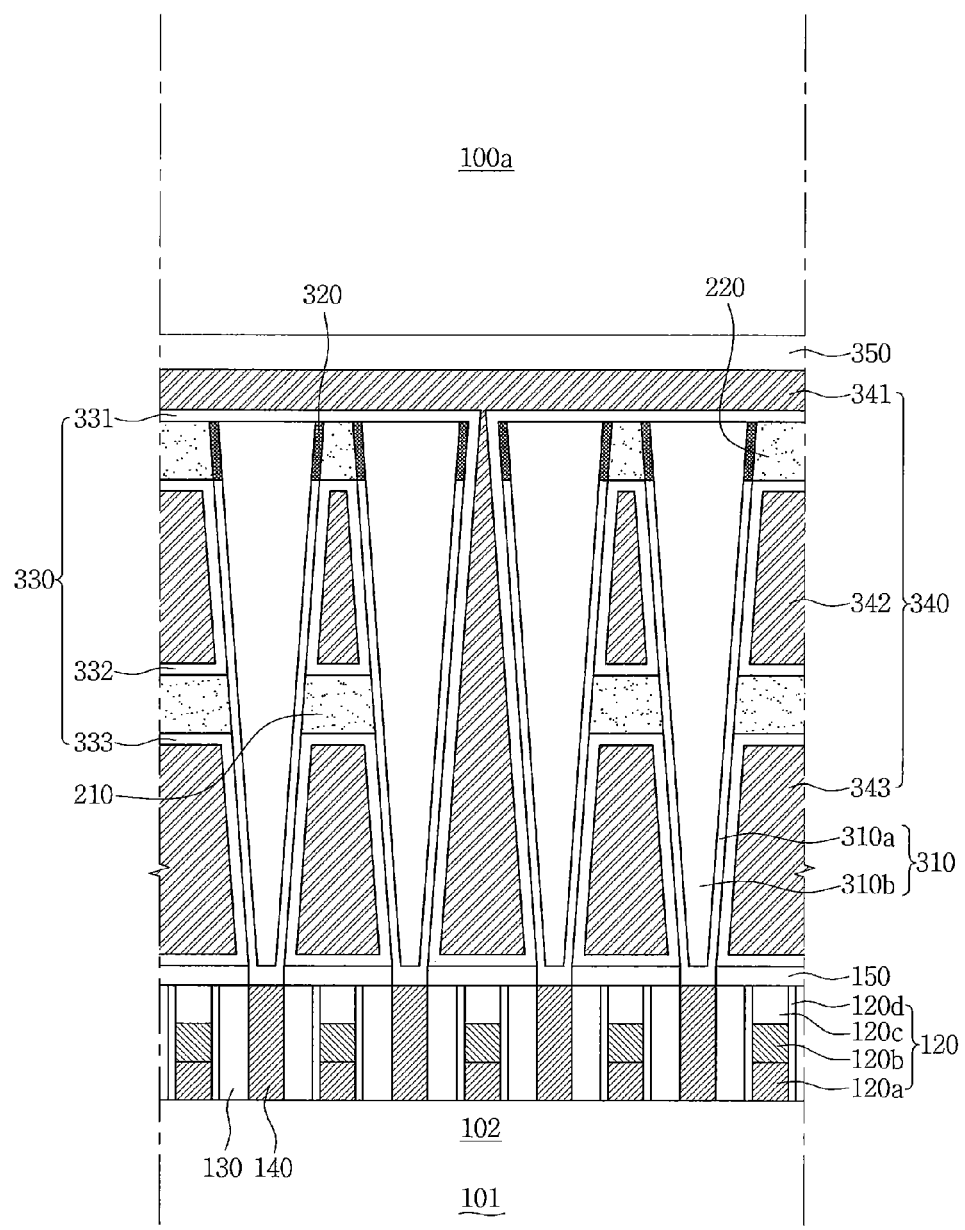
FIGS. 1A to 1C are cross-sectional views illustrating semiconductor devices in accordance with various embodiments of the present inventive concepts.

Various embodiments will now be described more fully with reference to the accompanying drawings in which some embodiments are shown. The present inventive concepts may, however, be embodied in different forms and should not be construed as limited to the embodiments set forth herein. Rather, these embodiments are provided so that this disclosure is thorough and complete and fully conveys the present inventive concepts to those skilled in the art.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The exemplary embodiments of the present inventive concepts will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of the present inventive concepts are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the present inventive concepts.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

Figure 1B:
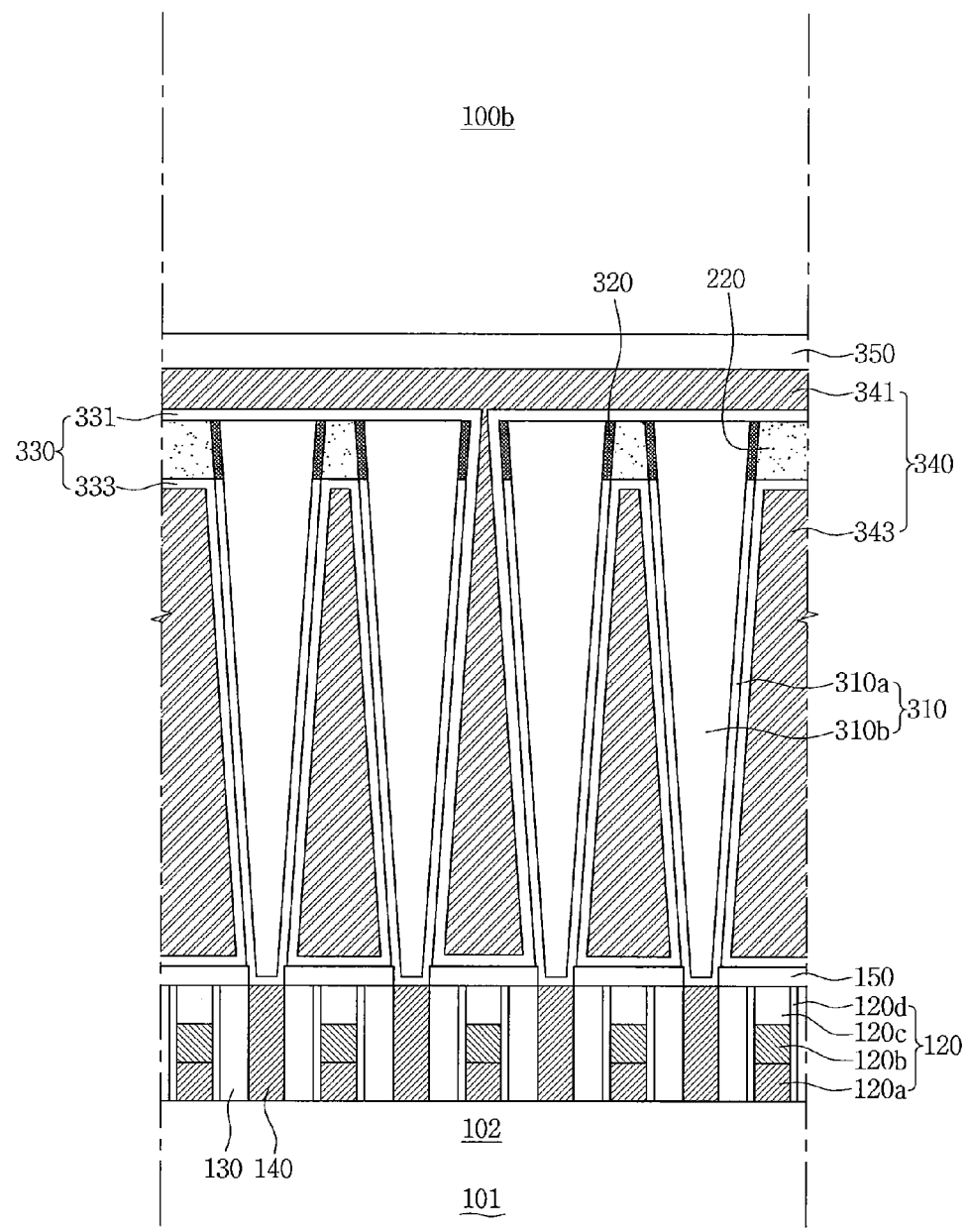
Figure 1C:
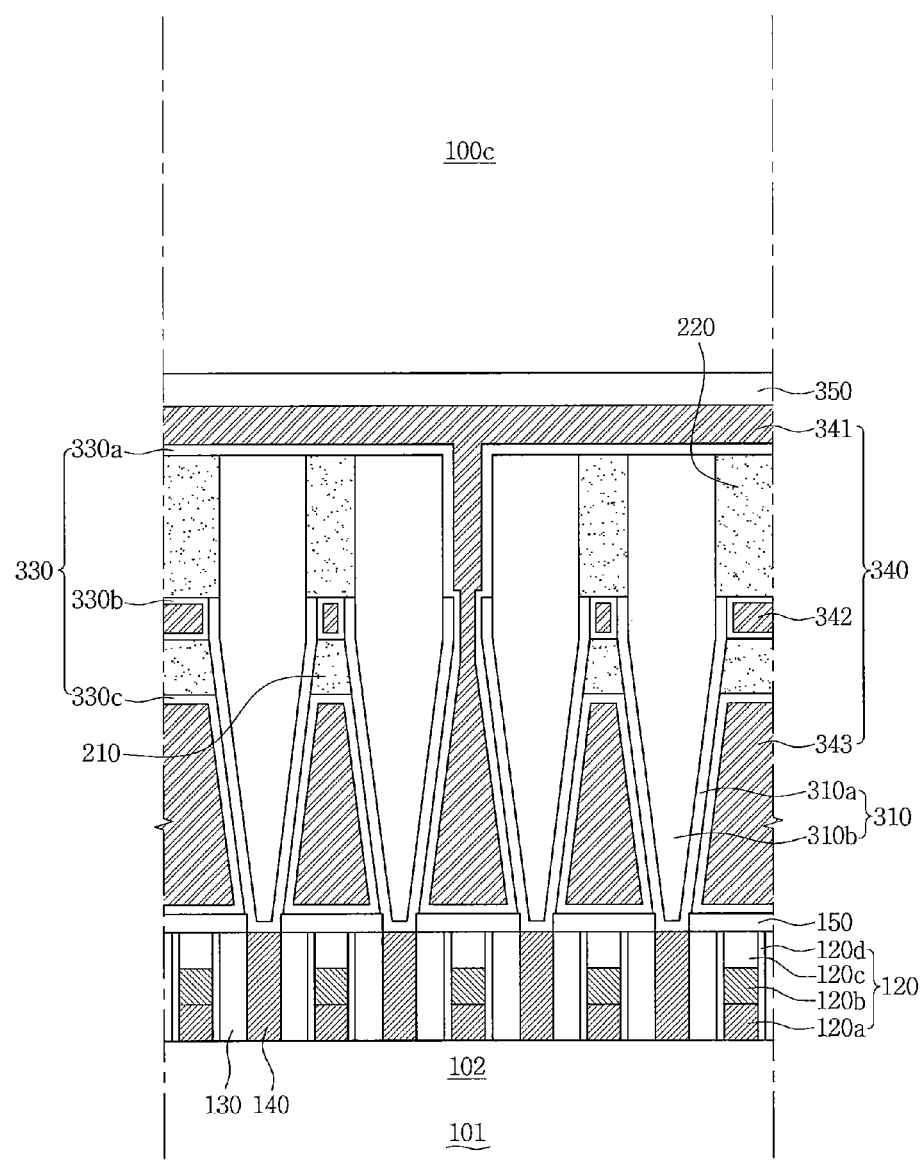

FIGS. 1A to 1C are cross-sectional views illustrating semiconductor devices in accordance with various embodiments of the present inventive concepts.

Referring to FIG. 1A, a semiconductor device 100a in accordance with embodiments of the present inventive concepts may include a substrate 101 including an active area 102, bit line structures 120, an interlayer insulating layer 130, contact pads 140, a stopping insulating layer 150, storage electrode groups 310, lower supporters 210, upper supporters 220, side supporters 320, a capacitor dielectric layer 330, plate electrodes 340, and a capacitor capping layer 350. Each of the storage electrode groups 310 may include a storage barrier layer 310a and a storage electrode 310b. The capacitor dielectric layer 330 may include an upper capacitor dielectric layer 331, an intermediate capacitor dielectric layer 332, and a lower capacitor dielectric layer 333. The plate electrode 340 may include an upper plate electrode 341, an intermediate plate electrode 342, and a lower plate electrode 343.

The substrate 101 may include a single-crystalline silicon wafer, a silicon on insulator (SOI) wafer, a silicon-germanium wafer, etc.

The active area 102 of the substrate 101 may be defined by isolation areas.

The bit line structures 120 may be formed on the active area 102. Each of the bit line structures 120 may include a bit line contact plug 120a, a bit line electrode 120b, a bit line capping layer 120c, and a bit line spacer 120d.

The bit line contact plug 120a may include, for example, any one of single-crystalline silicon layer formed by an epitaxial growth process, a silicide layer, and a metal layer. The bit line electrode 120b may include a conductor such as a metal. The bit line capping layer 120c and the bit line spacer 120d may include an insulating material such as silicon nitride.

The interlayer insulating layer 130 may cover the active area 102 between the bit line structures 120. The interlayer insulating layer 130 may surround side surfaces of the bit line structures 120. An upper surface of the interlayer insulating layer 130 may be coplanar with upper surfaces of the bit line structures 120. The interlayer insulating layer 130 may include silicon oxide.

The contact pads 140 may penetrate the interlayer insulating layer 130. The contact pads 140 may contact the active area 102. Upper surfaces of the contact pads 140 may contact the storage barrier layers 310a. The contact pads 140 may include any one of, for example, a single-crystalline silicon layer formed by an epitaxial growth process, a silicide layer, and a metal layer.

The stopping insulating layer 150 may be formed on the bit line structures 120 and the interlayer insulating layer 130. The stopping insulating layer 150 may include a material having an etch selectivity with respect to the interlayer insulating layer 130.

The storage barrier layer 310a may be formed on an upper surface of the contact pad 140, a side surface of the intermediate capacitor dielectric layer 332, a side surface of the lower supporter 210, and a side surface of the lower capacitor dielectric layer 333. An upper surface of the storage barrier layer 310a may be coplanar with an upper surface of the intermediate capacitor dielectric layer 332.

The storage electrode 310b may be formed on the storage barrier layer 310a. The storage electrode 310b may be formed on a side surface of the side supporter 320. An upper surface of the storage electrode 310b may be coplanar with an upper surface of the upper supporter 220 and an upper surface of the side supporter 320. The storage barrier layer 310a and the storage electrode 310b may include any one of, for example, silicon, a silicide metal, and a metal compound.

The lower supporter 210 may be formed on the lower capacitor dielectric layer 333. The lower supporter 210 may include an insulating material such as silicon nitride.

The upper supporter 220 may be formed on the intermediate capacitor dielectric layer 332. The upper supporter 220 may include an insulating material such as silicon nitride.

The side supporter 320 may be formed on side surfaces of the upper supporter 220. The side supporter 320 may include silicon nitride. The side supporter 320 may serve to support the storage electrode 310b.

The upper capacitor dielectric layer 331 may be formed on an upper surface of the upper supporter 220, an upper surface of the side supporter 320, and an upper surface of the storage electrode 310b. The upper capacitor dielectric layer 331 may be formed on a side surface of some of the storage barrier layers 310a. The intermediate capacitor dielectric layer 332 may be formed on a lower surface of the upper supporter 220, an upper surface of the lower supporter 210, and the side surface of the storage barrier layer 310a. The lower capacitor dielectric layer 333 may be formed on a lower surface of the lower supporter 210, an upper surface of the stopping insulating layer 150, and the side surface of the storage barrier layer 310a. The upper capacitor dielectric layer 331, the intermediate capacitor dielectric layer 332, and the lower capacitor dielectric layer 333 may include a dielectric material.

The upper plate electrode 341 may be formed on the upper capacitor dielectric layer 331. The intermediate plate electrode 342 may be formed on the intermediate capacitor dielectric layer 332. The lower plate electrode 343 may be formed on the lower capacitor dielectric layer 333. The upper plate electrode 341, the intermediate plate electrode 342, and the lower plate electrode 343 may include a barrier metal layer such as titanium nitride (TiN).

The capacitor capping layer 350 may be formed on the upper plate electrode 341. The capacitor capping layer 350 may include silicon-germanium (SiGe) or silicon oxide.

Referring to FIG. 1B, semiconductor devices 100b in accordance with embodiments of the present inventive concepts may include a substrate 101 including an active area 102, bit line structures 120, a interlayer insulating layer 130, contact pads 140, a stopping insulating layer 150, storage electrode groups 310, upper supporters 220, side supporters 320, a capacitor dielectric layer 330, plate electrodes 340, and a capacitor capping layer 350. Each storage electrode group 310 may include a storage barrier layer 310a and a storage electrode 310b. The capacitor dielectric layer 330 may include an upper capacitor dielectric layer 331 and a lower capacitor dielectric layer 333. The plate electrode 340 may include an upper plate electrode 341 and a lower plate electrode 343.

The upper supporter 220 may be formed on the lower capacitor dielectric layer 333. The upper supporter 220 may include an insulating material such as silicon nitride.

A storage barrier layer 310a may be formed on an upper surface of the contact pad 140 and side surfaces of the lower capacitor dielectric layer 333.

The storage electrode 310b may be formed on the storage barrier layer 310a. The storage electrode 310b may be formed on a side surface of the side supporter 320. An upper surface of the storage electrode 310b may be coplanar with an upper surface of the upper supporter 220 and an upper surface of the side supporter 320.

The side supporter 320 may be formed on a side surface of the upper supporter 220. The side supporter 320 may include silicon nitride.

The upper capacitor dielectric layer 331 may be formed on an upper surface of the upper supporter 220, and an upper surface of the storage electrode 310b. The upper capacitor dielectric layer 331 may be formed on an upper surface of a portion of the stopping insulating layer 150. The upper capacitor dielectric layer 331 may be formed on a side surface of some of the storage barrier layers 310a. The upper capacitor dielectric layer 331 may be formed on a side surface of some of the side supporter 320. The lower capacitor dielectric layer 333 may be formed on a lower surface of the upper supporter 220, an upper surface of the stopping insulating layer 150, and the side surface of the storage barrier layer 310a.

The upper plate electrode 341 may be formed on the upper capacitor dielectric layer 331. The lower plate electrode 343 may be formed on the lower capacitor dielectric layer 333. The upper plate electrode 341 and the lower plate electrode 343 may include a metal such as titanium nitride (TiN) or a metal compound.

Referring to FIG. 1C, semiconductor devices 100c in accordance with still other embodiments of the present inventive concepts may include a substrate 101 including an active area 102, bit line structures 120, an interlayer insulating layer 130, contact pads 140, a stopping insulating layer 150, storage electrode groups 310, lower supporters 210, upper supporters 220, a capacitor dielectric layer 330, plate electrodes 340, and a capacitor capping layer 350. Each of the storage electrode groups 310 may include a storage barrier layer 310a and a storage electrode 310b. The capacitor dielectric layer 330 may have an upper part 330a, an intermediate part 330b, and a lower part 330c. The plate electrode 340 may include an upper plate electrode 341, an intermediate plate electrode 342, and a lower plate electrode 343.

The storage barrier layer 310a may be formed on an upper surface of the contact pad 140, a side surface of the intermediate part 330b of the capacitor dielectric layer 330, a side surface of the lower supporter 210, and a side surface of the lower part 330c of the capacitor dielectric layer 330.

The storage electrode 310b may be formed on a side surface of the storage barrier layer 310a and a side surface of the upper supporter 220.

The lower supporter 210 may be formed on the lower part 330c of the capacitor dielectric layer 330.

The upper supporter 220 may be formed on the intermediate part 330b of the capacitor dielectric layer 330, and on the storage barrier layer 310a.

The upper part 330a of the capacitor dielectric layer 330 may be formed on an upper surface of the upper supporter 220 and an upper surface of the storage electrode 310b. The upper part 330a of the capacitor dielectric layer 330 may be formed on a side surface of some of the storage electrodes 310b. The upper part 330a of the capacitor dielectric layer 330 may be formed on a side surface of some of the storage barrier layer 310a. The intermediate part 330b of the capacitor dielectric layer 330 may be formed on a lower surface of the upper supporter 220, an upper surface of the lower supporter 210, and a side surface of the storage barrier layer 310a. The lower part 330c of the capacitor dielectric layer 330 may be formed on a lower surface of the lower supporter 210, an upper surface of the stopping insulating layer 150, and the side surface of the storage barrier layer 310a.

The upper plate electrode 341 may be formed on the upper part 330a of the capacitor dielectric layer 330. The intermediate plate electrode 342 may be formed on the intermediate part 330b of the capacitor dielectric layer 330. The lower plate electrode 343 may be formed on the lower part 330c of the capacitor dielectric layer 330.

FIGS. 2A to 2J are cross-sectional views sequentially illustrating methods of fabricating semiconductor devices in accordance with embodiments of the present inventive concepts.

Methods of fabricating semiconductor devices 100a in accordance with embodiments of the present inventive concepts will now be explained with reference to FIGS. 1A and 2A to 2J. First referring to FIG. 2A, methods for fabricating semiconductor devices 100a in accordance with the present inventive concepts may include a process of forming bit line structures 120 on an active area 102 of a substrate 101, a process of forming an interlayer insulating layer 130 between the bit line structures 120, a process of forming contact pads 140 in the interlayer insulating layer 130, a process of forming a stopping insulating layer 150 on the bit line structures 120, the interlayer insulating layer 130 and the contact pads 140, a process of forming a lower molding layer 205 on the stopping insulating layer 150, a process of forming a lower supporter 210 on the lower molding layer 205, a process of forming an upper molding layer 215 on the lower supporter 210, a process of forming an upper supporter 220 on the upper molding layer 215, and a process of forming a first mask pattern 250 on the upper supporter 220.

The process of forming the bit line structures 120 may include a process of forming bit line contact plugs 120a connected to the active area 102 of the substrate 101, a process of forming bit line electrodes 120b on the bit line contact plugs 120a, a process of forming bit line capping layers 120c on the bit line electrodes 120b, and a process of forming bit line spacers 120d on side surfaces of the bit line contact plugs 120a, the bit line electrodes 120b, and the bit line capping layers 120c.

The process of forming the bit line contact plugs 120a may include a process of forming conductors which directly contact the active area 102. For example, the process of forming the bit line contact plugs 120a may include a process of forming a single-crystalline silicon layer on the active area 102 using an epitaxial growth process. Alternatively, the process of forming the bit line contact plugs 120a may include a process of forming a silicide layer or a metal layer on the active area 102.

The process of forming the bit line electrodes 120b may include a process of forming conductors on the bit line contact plugs 120a. For example, the process of forming the bit line electrodes 120b may include a process of forming a metal such as tungsten (W).

In methods of fabricating semiconductor devices in accordance with embodiments of the present inventive concepts, bit line barrier layers may be formed between the bit line contact plugs 120a and the bit line electrodes 120b. For example, the methods may further include a process of forming the bit line barrier layers by depositing titanium (Ti), titanium nitride (TiN), tantalum (Ta), tantalum nitride (TaN), titanium tungsten (TiW), tungsten silicide (WSi), or another barrier metal on the bit line contact plugs 120a.

The process of forming the bit line capping layers 120c may include a process of forming silicon nitride by a deposition process. The process of forming the bit line spacers 120d may include a process of forming silicon nitride by performing a deposition process, and an etch-back process.

The process of forming the interlayer insulating layer 130 may include a process of filling a space between the bit line structures 120 with an insulating material. For example, the process of forming the interlayer insulating layer 130 may include a process of depositing silicon oxide.

The process of forming the contact pads 140 may include a process of forming conductors which contact the bit line spacers 120d and the active area 102, where the contact pads 140 penetrate the interlayer insulating layer 130. For example, the process of forming the contact pads 140 may include a process of forming a single-crystalline silicon on the active area 102 using an epitaxial growth process. Alternatively, the process of forming the contact pads 140 may include a process of forming a silicide layer or a metal layer on the active area 102.

The process of forming the stopping insulating layer 150 may include a process of depositing a material having an etch selectivity with respect to the interlayer insulating layer 130. For example, the process of forming the stopping insulating layer 150 may include a process of forming a silicon nitride layer on the bit line structures 120, the interlayer insulating layer 130, and the contact pads 140.

The process of forming the lower molding layer 205 may include a process of depositing a material having an etch selectivity with respect to the stopping insulating layer 150. The process of forming the lower molding layer 205 may include a deposition process or a coating process. For example, the process of forming the lower molding layer 205 may include a process of forming a silicon oxide layer on the stopping insulating layer 150.

The process of forming the lower supporter 210 may include a process of depositing an insulating material having an etch selectivity with respect to the lower molding layer 205. The process of forming the lower supporter 210 may include a process of forming an insulating material that is relatively harder than the lower molding layer 205. For example, the process of forming the lower supporter 210 may include a process of forming a silicon nitride layer on the lower molding layer 205.

The process of forming the upper molding layer 215 may include a process of depositing a material having an etch selectivity with respect to the lower molding layer 205 and the lower supporter 210. For example, the process of forming the upper molding layer 215 may include a process of forming a silicon oxide layer on the lower supporter 210. For example, the upper molding layer 215 may include the same material as the lower molding layer 205.

The process of forming the upper supporter 220 may include a process of depositing an insulating material having an etch selectivity with respect to the upper molding layer 215. For example, the process of forming the upper supporter 220 may include a process of forming a silicon nitride layer on the upper molding layer 215. For example, the upper supporter 220 may include the same material as the lower supporter 210.

The process of forming the first mask pattern 250 may include a process of forming a material having an etch selectivity with respect to silicon nitride on the upper supporter 220, and a process of selectively exposing the upper supporter 220 by performing a photolithography process. For example, the first mask pattern 250 may include a photoresist, a polycrystalline silicon layer, an amorphous silicon layer, a silicon oxide layer, a silicon oxynitride layer, or a high molecular weight organic material layer. The process of forming the first mask pattern 250 may include performing a photolithography process using a KrF laser, an ArF laser, extreme ultraviolet (EUV) rays, or X-rays.

Figure 2A:
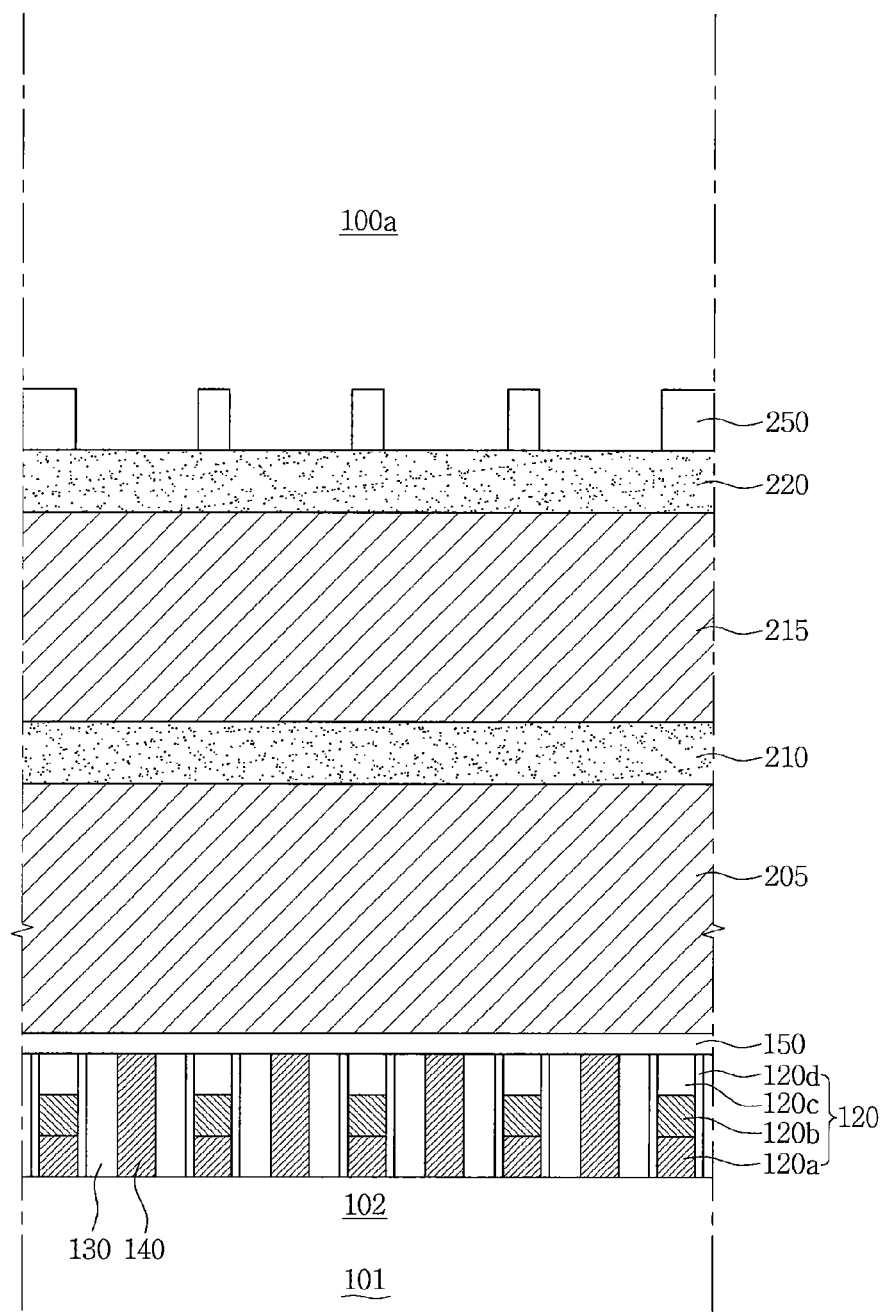
FIGS. 2A to 2J, 3A to 3J and 4A to 4K are cross-sectional views sequentially illustrating methods of fabricating semiconductor devices in accordance with various embodiments of the present inventive concepts.
Figure 2B:
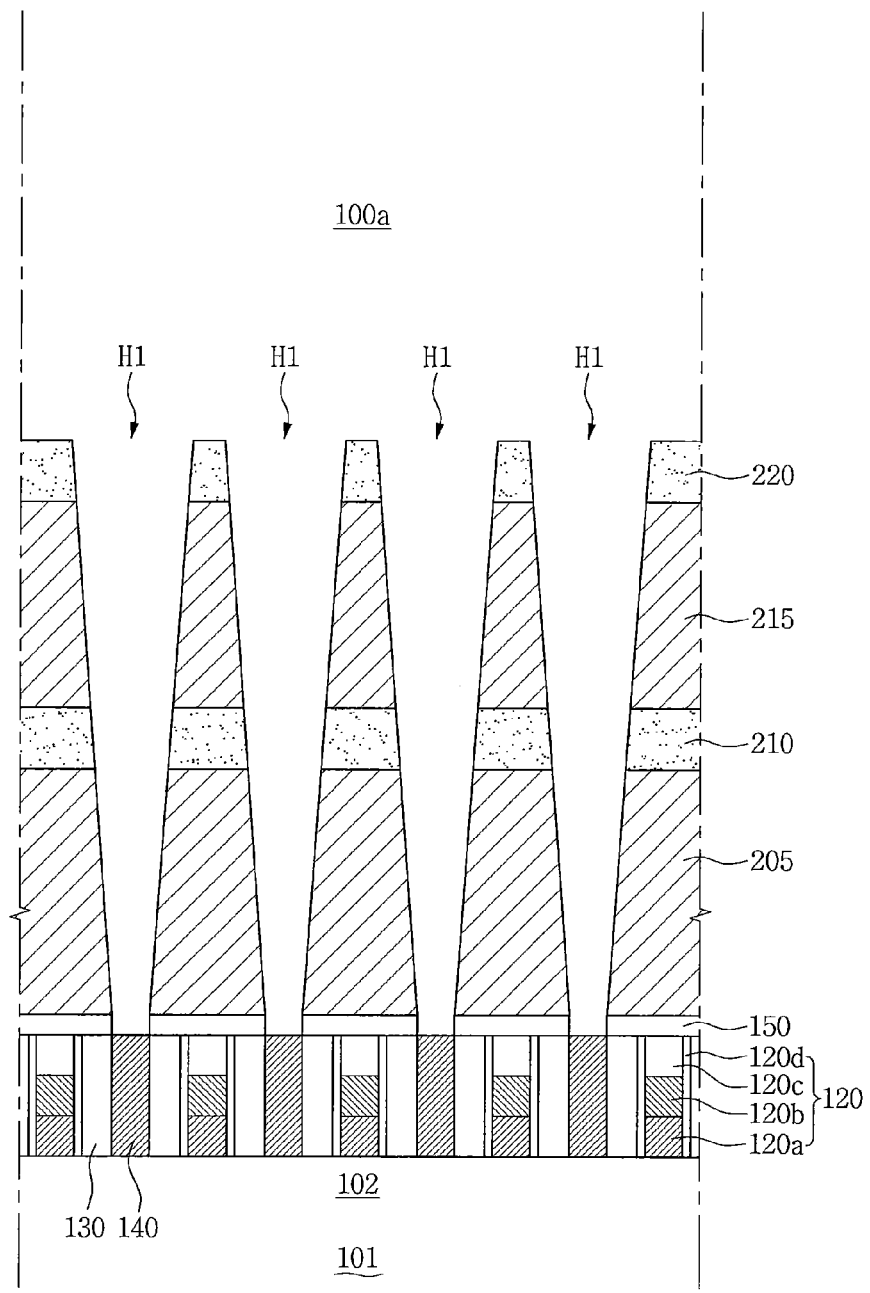

Referring to FIG. 2B, methods of fabricating semiconductor devices 100a in accordance with embodiments of the present inventive concepts may include a process of forming first holes H1 in the upper supporter 220, the upper molding layer 215, the lower supporter 210, the lower molding layer 205, and the stopping insulating layer 150 that expose upper surfaces of the contact pads 140, and a process of removing the first mask pattern 250.

The process of forming first holes H1 may include selectively removing the upper supporter 220, the upper molding layer 215, the lower supporter 210, the lower molding layer 205, and the stopping insulating layer 150 using the first mask pattern 250 as an etch mask.

Figure 2C:
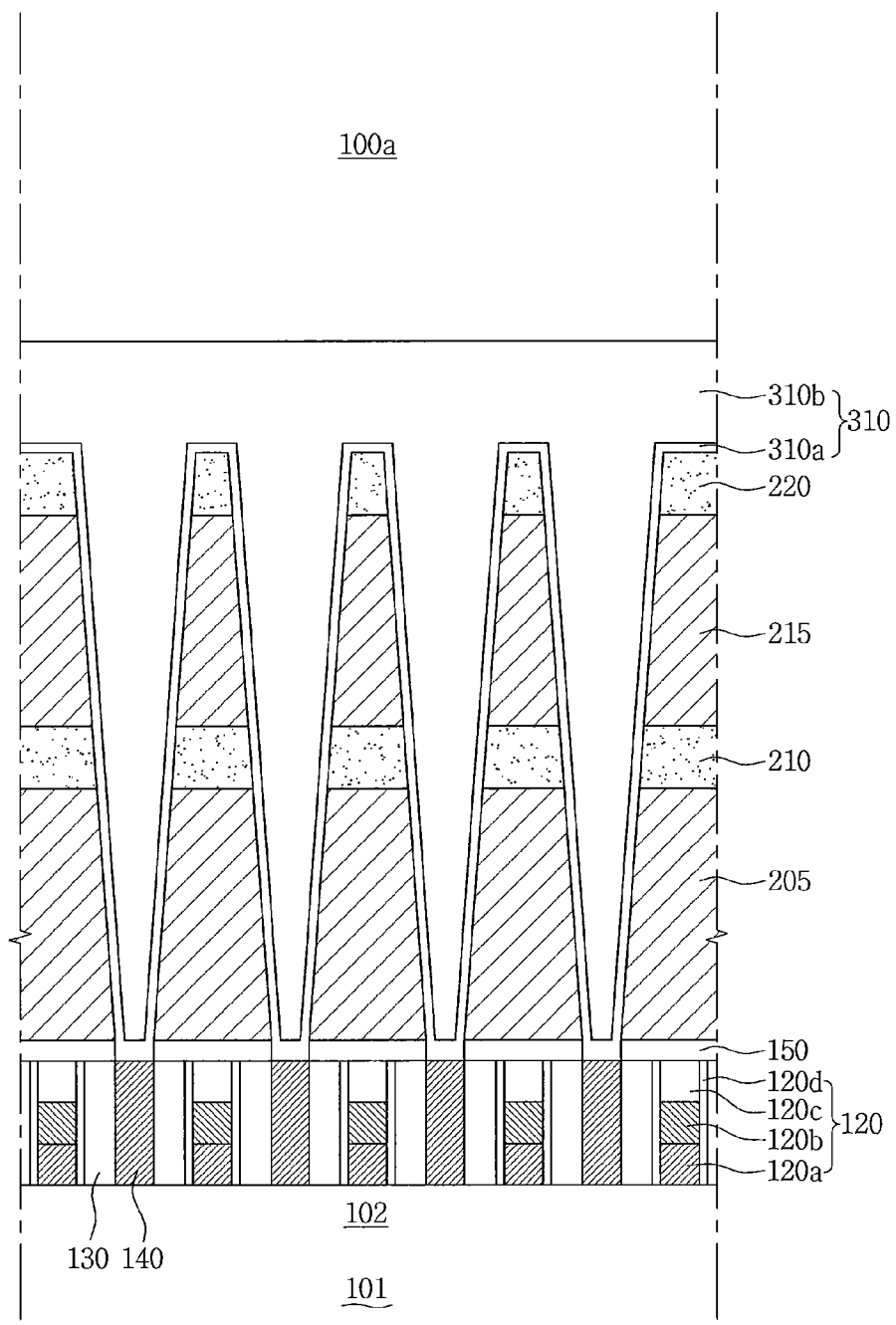

Referring to FIG. 2C, methods of fabricating semiconductor devices 100a in accordance with embodiments of the present inventive concepts may include a process of forming a storage electrode group 310 in the first holes H1.

The process of forming the storage electrode group 310 may include a process of forming a storage barrier layer 310a on surfaces of the first holes H1, and a process of forming a storage electrode 310b on the storage barrier layer 310a.

The process of forming the storage electrode group 310 may include a process of forming a layer including any one of silicon, a silicide, a metal, and a metal compound. For example, the process of forming the storage electrode group 310 may include a process of forming the storage barrier layer 310a with titanium nitride (TiN), and a process of forming the storage electrode 310b with tungsten (W). The storage electrode group 310 may act as a lower electrode of a capacitor.

Figure 2D:
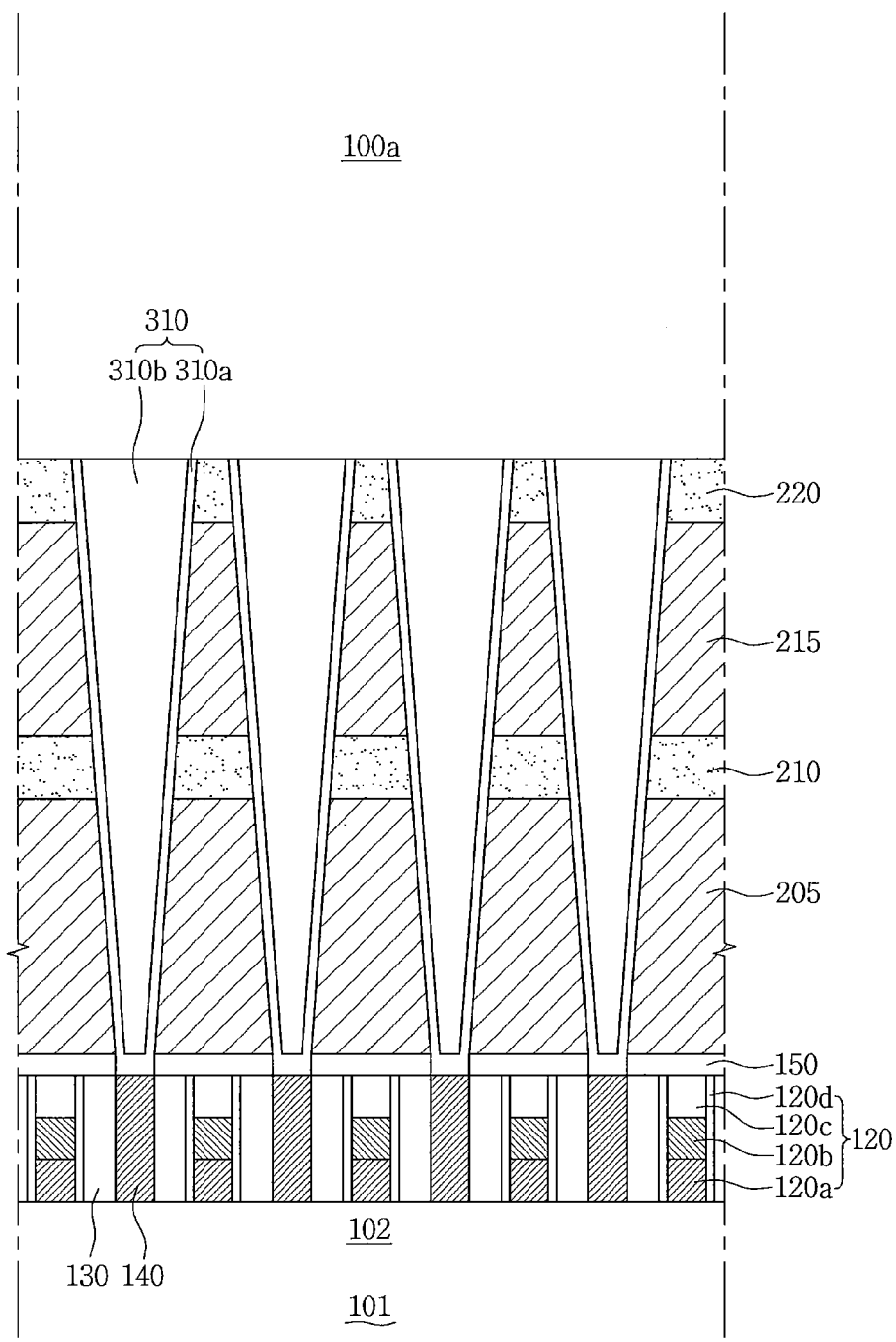

Referring to FIG. 2D, methods of fabricating semiconductor devices 100a in accordance with embodiments of the present inventive concepts may include a process of planarizing the storage electrode group 310.

The process of planarizing the storage electrode group 310 may include a process of electrically and physically separating the storage barrier layer 310a and the storage electrode 310b filling the adjacent first holes H1. Upper surfaces of the separated storage barrier layers 310a and upper surfaces of the separated storage electrodes 310b may be coplanar with an upper surface of the upper supporter 220. The process of planarizing the storage electrode group 310 may include a chemical mechanical polishing (CMP) process or an etch-back process.

Figure 2E:
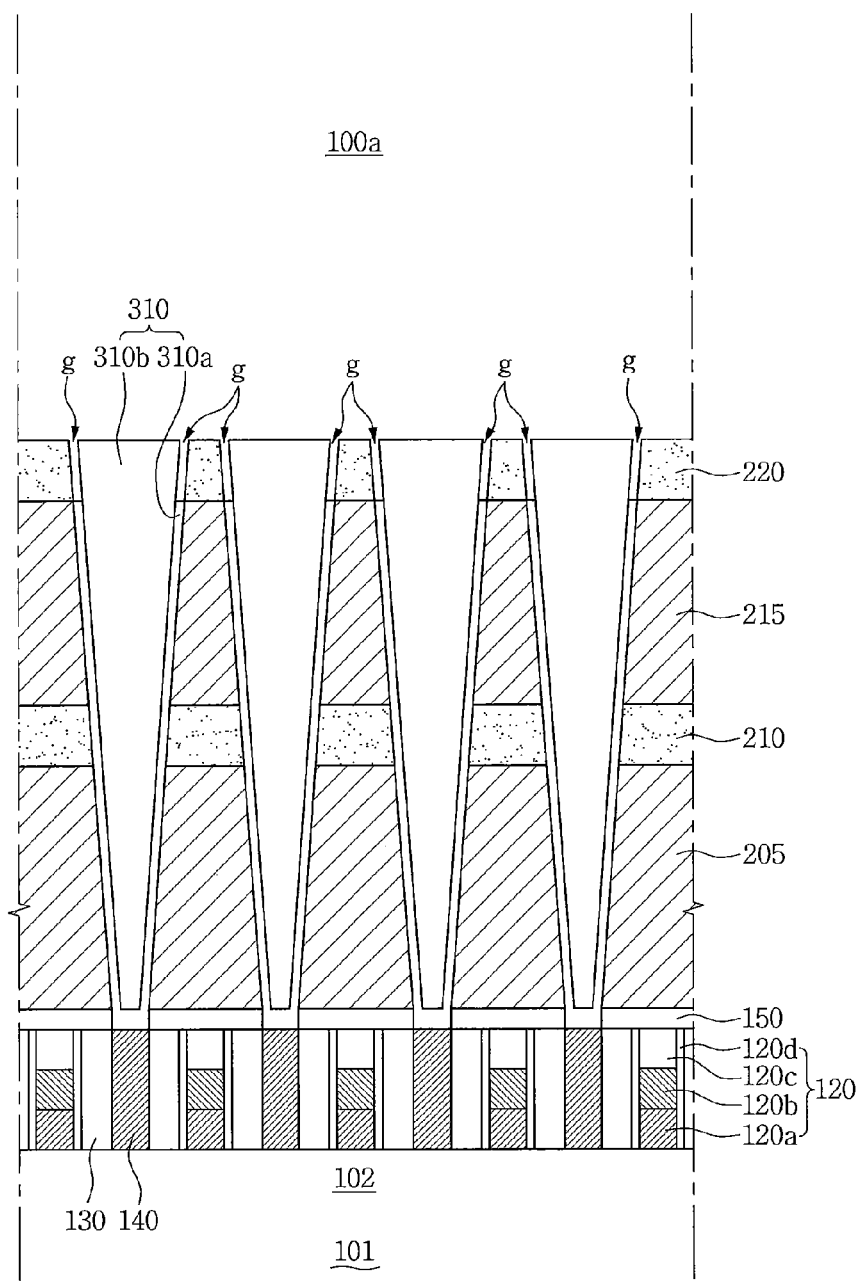

Referring to FIG. 2E, methods of fabricating semiconductor devices 100a in accordance with embodiments of the present inventive concepts may include a process of forming gaps g between the storage electrodes 310b and the upper supporters 220.

The process of forming gaps g may include a process of partially removing upper parts of the storage barrier layer 310a. The process of partially removing upper parts of the storage barrier layer 310a may include a wet etching process using an etchant.

Figure 2F:
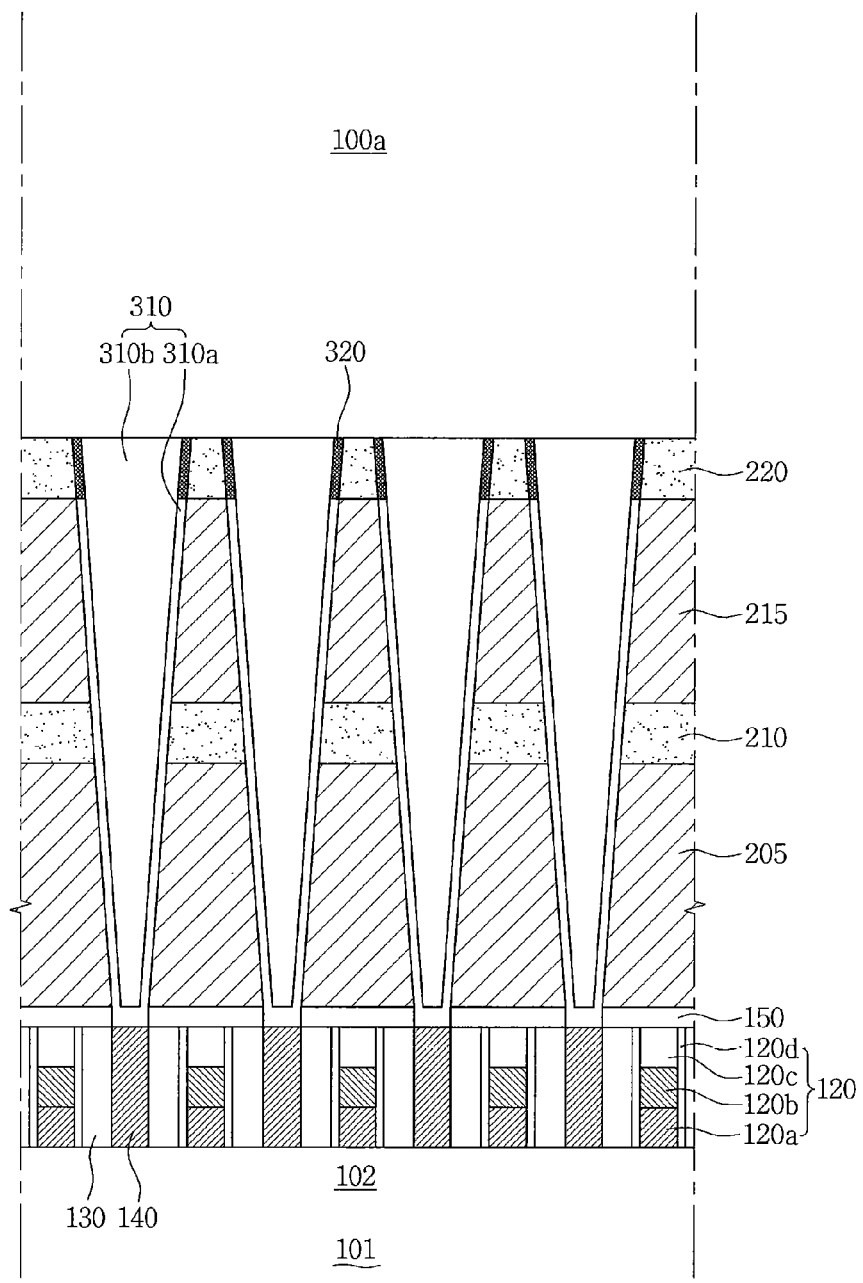

Referring to FIG. 2F, methods of fabricating semiconductor devices 100a in accordance with embodiments of the present inventive concepts may include a process of forming side supporters 320 in the gaps g.

The process of forming the side supporters 320 may include a process of filling the gaps g with an insulating material. For example, the process of forming the side supporters 320 may include a process of filling the gaps g with a silicon nitride material. For example, the process of forming the side supporters 320 may include a planarization process such as a CMP process.

Figure 2G:
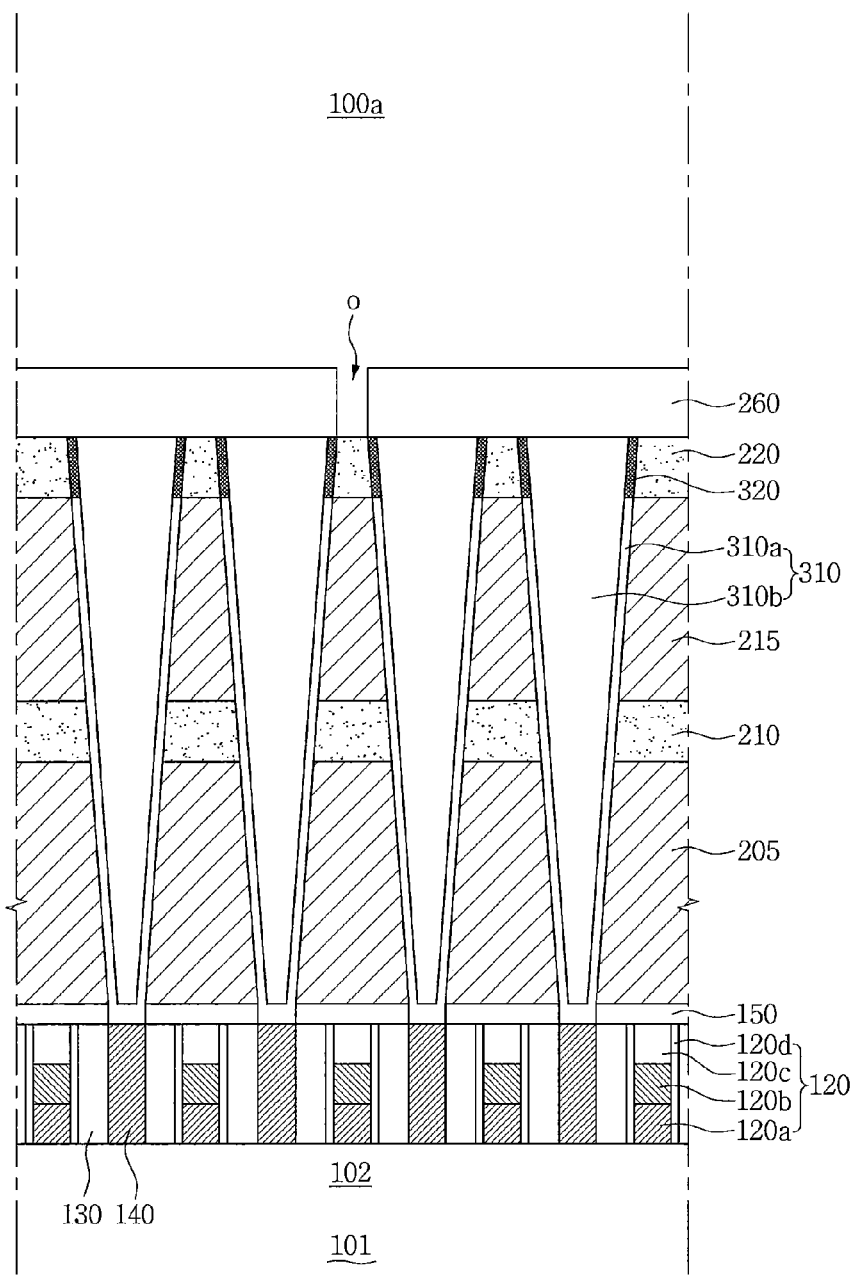

Referring to FIG. 2G, methods of fabricating semiconductor devices 100a in accordance with embodiments of the present inventive concepts may include a process of forming a second mask pattern 260 on the storage electrodes 310b, the upper supporters 220, and the side supporters 320.

The second mask pattern 260 may include an opening O which selectively exposes the upper surfaces of some of the upper supporters 220. For example, the second mask pattern 260 may include a photoresist, silicon oxide, or a silicon layer.

Figure 2H:
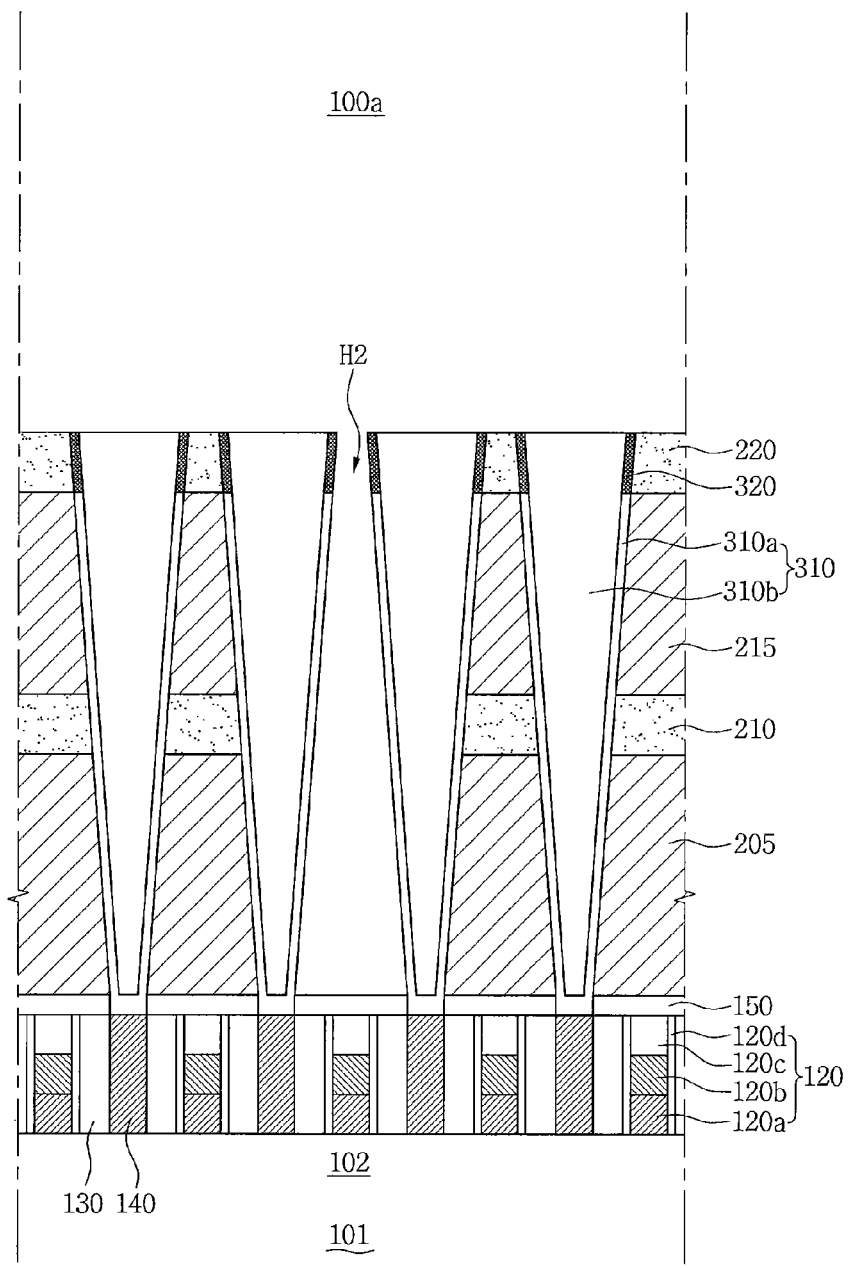

Referring to FIG. 2H, methods of fabricating semiconductor devices 100a in accordance with embodiments of the present inventive concepts may include a process of forming a second hole H2 which exposes the stopping insulating layer 150 using the second mask pattern 260, and a process of removing the second mask pattern 260.

The process of forming the second hole H2 may include a process of selectively removing the upper supporter 220, the upper molding layer 215, the lower supporter 210, and the lower molding layer 205 using the second mask pattern 260 as an etch mask. An upper surface of the stopping insulating layer 150, side surfaces of the side supporter 320, and side surfaces of the storage barrier layers 310a may be exposed by the second hole H2.

Figure 2I:
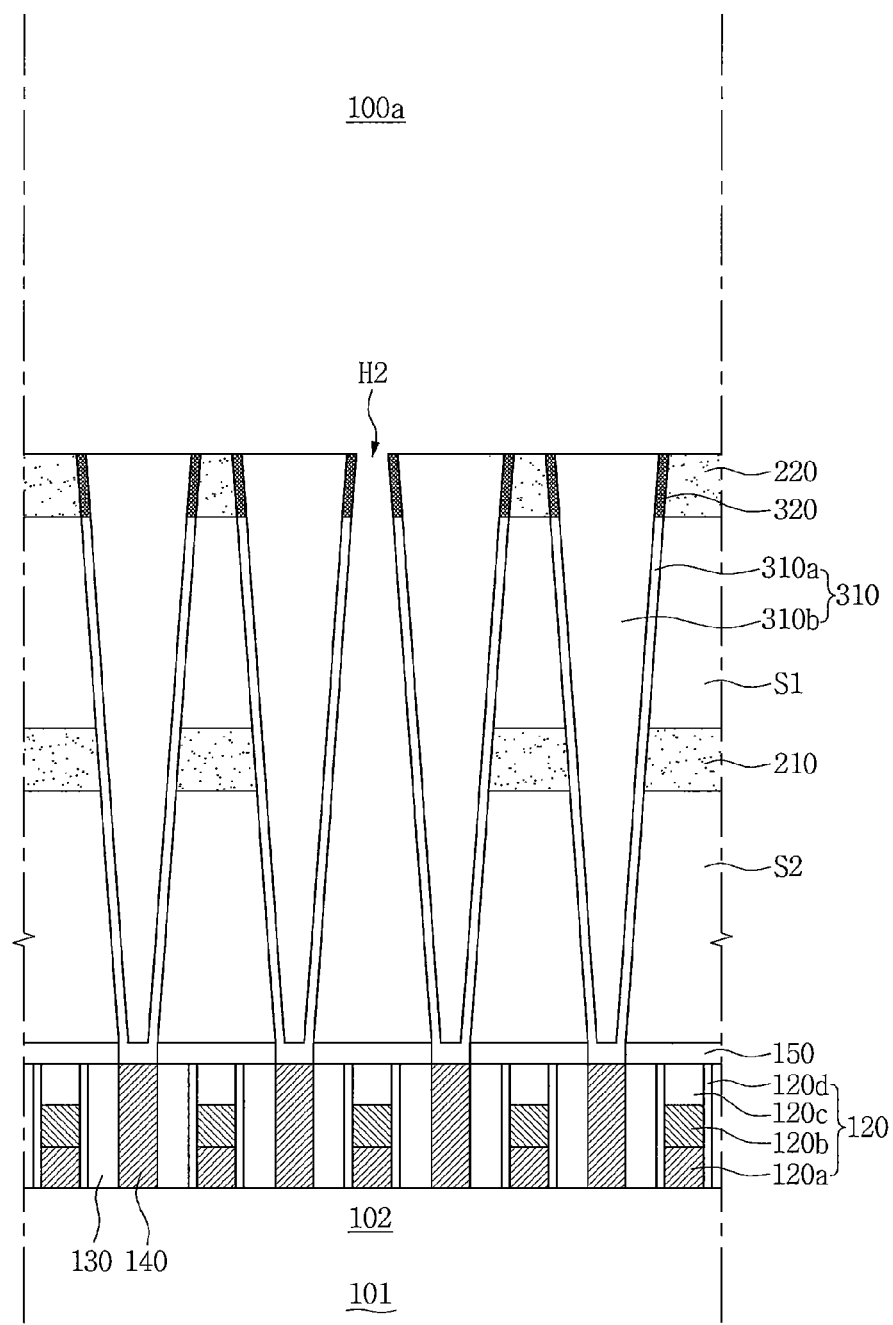

Referring to FIG. 2I, methods of fabricating semiconductor devices 100a in accordance with embodiments of the present inventive concepts may include a process of forming upper spaces S1 and lower spaces S2.

The process of forming upper spaces S1 and lower spaces S2 may include a process of removing the upper molding layer 215 and the lower molding layer 205. The process of removing the upper molding layer 215 and the lower molding layer 205 may include a wet etching process which uses hydrofluoric acid (HF). The wet etching process may include a process of removing the lower molding layers 205 and the upper molding layers 215 through the second hole H2.

Upper surfaces of the lower supporters 210 and side surfaces of the storage barrier layer 310a may be exposed by the upper spaces S1. Upper surfaces of the stopping insulating layer 150 and the side surfaces of the storage barrier layer 310a may be exposed by the lower spaces S2.

Figure 2J:
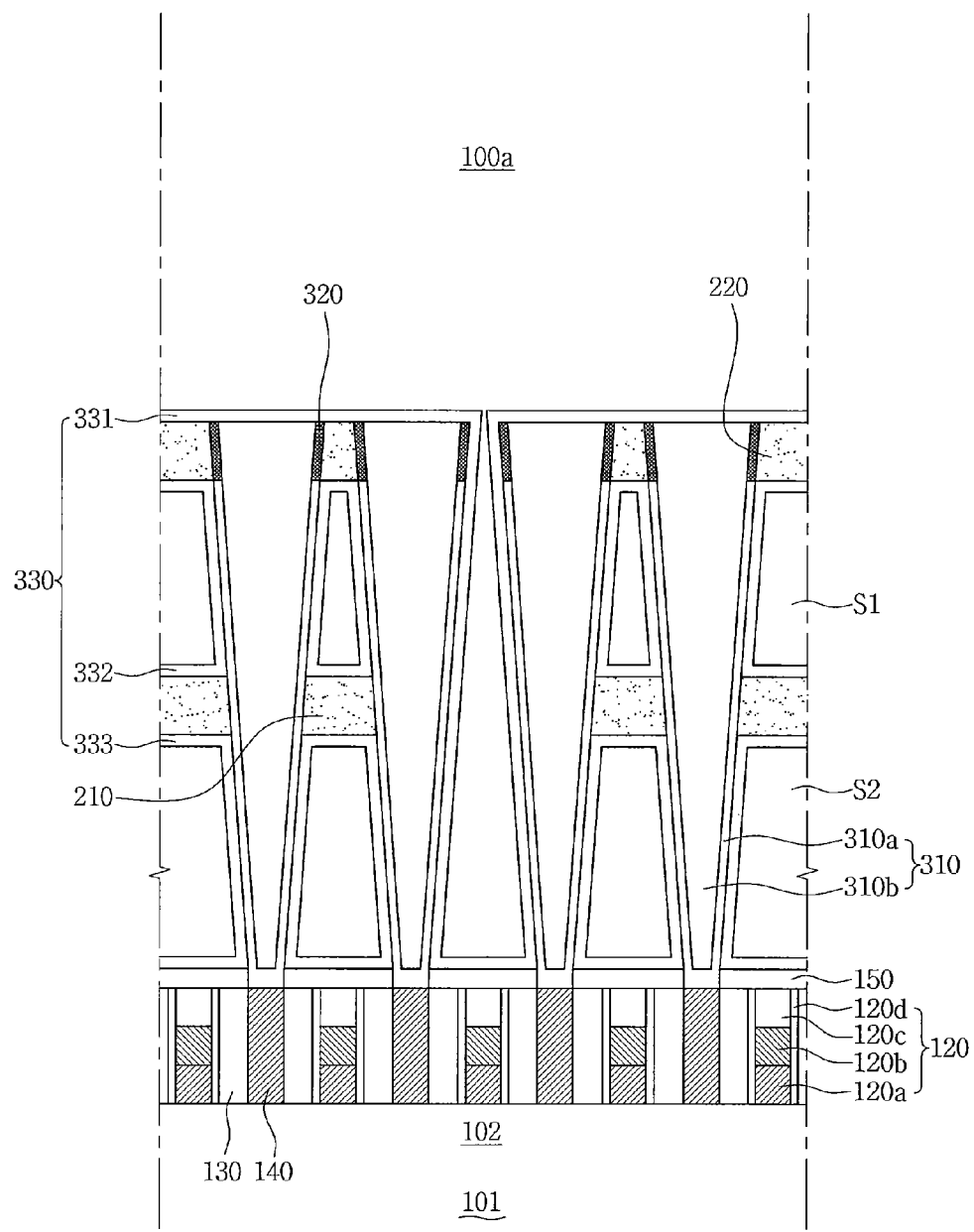

Referring to FIG. 2J, methods of fabricating semiconductor devices 100a in accordance with embodiments of the present inventive concepts may include a process of forming capacitor dielectric layer 330 in the upper spaces S1, the lower spaces S2 and the second hole H2.

The capacitor dielectric layer 330 may be conformally formed on surfaces of the storage barrier layers 310a, the stopping insulating layer 150, the lower supporters 210, and the upper supporters 220 that are exposed by the upper spaces S1, the lower spaces S2 and the second hole H2.

The capacitor dielectric layer 330 may include an upper capacitor dielectric layer 331, an intermediate capacitor dielectric layer 332, and a lower capacitor dielectric layer 333. The upper capacitor dielectric layer 331 may be formed on the upper surfaces of the upper supporters 220 and the upper surfaces of the side supporters 320. The upper capacitor dielectric layer 331 may be formed on surfaces of the storage barrier layers 310a, the stopping insulating layer 150, and the upper supporters 220 exposed by the second hole H2. The intermediate capacitor dielectric layer 332 may be formed on lower surfaces of the upper supporters 220, upper surfaces of the lower supporters 210, and side surfaces of upper parts of the storage barrier layers 310a. The intermediate capacitor dielectric layer 332 may be formed in the upper spaces S1. The lower capacitor dielectric layer 333 may be formed on the lower surfaces of the lower supporters 210, the upper surface of the stopping insulating layer 150, and side surfaces of lower parts of the storage barrier layers 310a. The lower capacitor dielectric layer 333 may be formed in the lower spaces S2.

The process of forming the capacitor dielectric layer 330 may include a process of depositing a high-k dielectric layer. For example, the process of forming the capacitor dielectric layer 330 may include a process of depositing hafnium oxide (HfO). For example, the process of forming the capacitor dielectric layer 330 may include an atomic layer deposition (ALD) process.

Referring to FIG. 1A, methods of fabricating semiconductor devices 100a in accordance with embodiments of the present inventive concepts may include a process of forming capacitor structures.

The process of forming the capacitor structures may include a process of forming a plate electrode 340 on the capacitor dielectric layer 330, and a process of forming a capacitor capping layer 350 on the plate electrode 340. The plate electrode 340 may act as an upper electrode of a capacitor.

The plate electrode 340 may include an upper plate electrode 341, an intermediate plate electrode 342, and a lower plate electrode 343. The upper plate electrode 341 may be formed on an upper surface of the upper capacitor dielectric layer 331. The intermediate plate electrode 342 may be formed on the intermediate capacitor dielectric layer 332. The intermediate plate electrode 342 may fill the remainder of the upper space S1. The lower plate electrode 343 may be formed on the lower capacitor dielectric layer 333. The lower plate electrode 343 may fill the remainder of the lower space S2.

The plate electrode 340 may include a conductive material. For example, the plate electrode 340 may include a metal or a metal compound. For example, the plate electrode 340 may include titanium nitride (TiN).

For example, the process of forming the capacitor capping layer 350 may include a process of forming a silicon germanium (SiGe) layer on the plate electrode 340.

FIGS. 3A to 3J are cross-sectional views sequentially illustrating methods of fabricating semiconductor devices in accordance with embodiments of the present inventive concepts.

Methods of fabricating semiconductor devices 100b in accordance with embodiments of the present inventive concepts will now be explained with reference to FIGS. 1B and 3A to 3J. First referring to FIG. 3A, methods of fabricating semiconductor devices 100b in accordance with embodiments of the present inventive concepts may include a process of forming bit line structures 120, an interlayer insulating layer 130 and contact pads 140 on an active area 102 of a substrate 101, and a process of sequentially forming a stopping insulating layer 150, a molding layer 235, an upper supporter 220, and a first mask pattern 250 on the bit line structures 120, the interlayer insulating layer 130 and the contact pads 140.

Figure 3A:
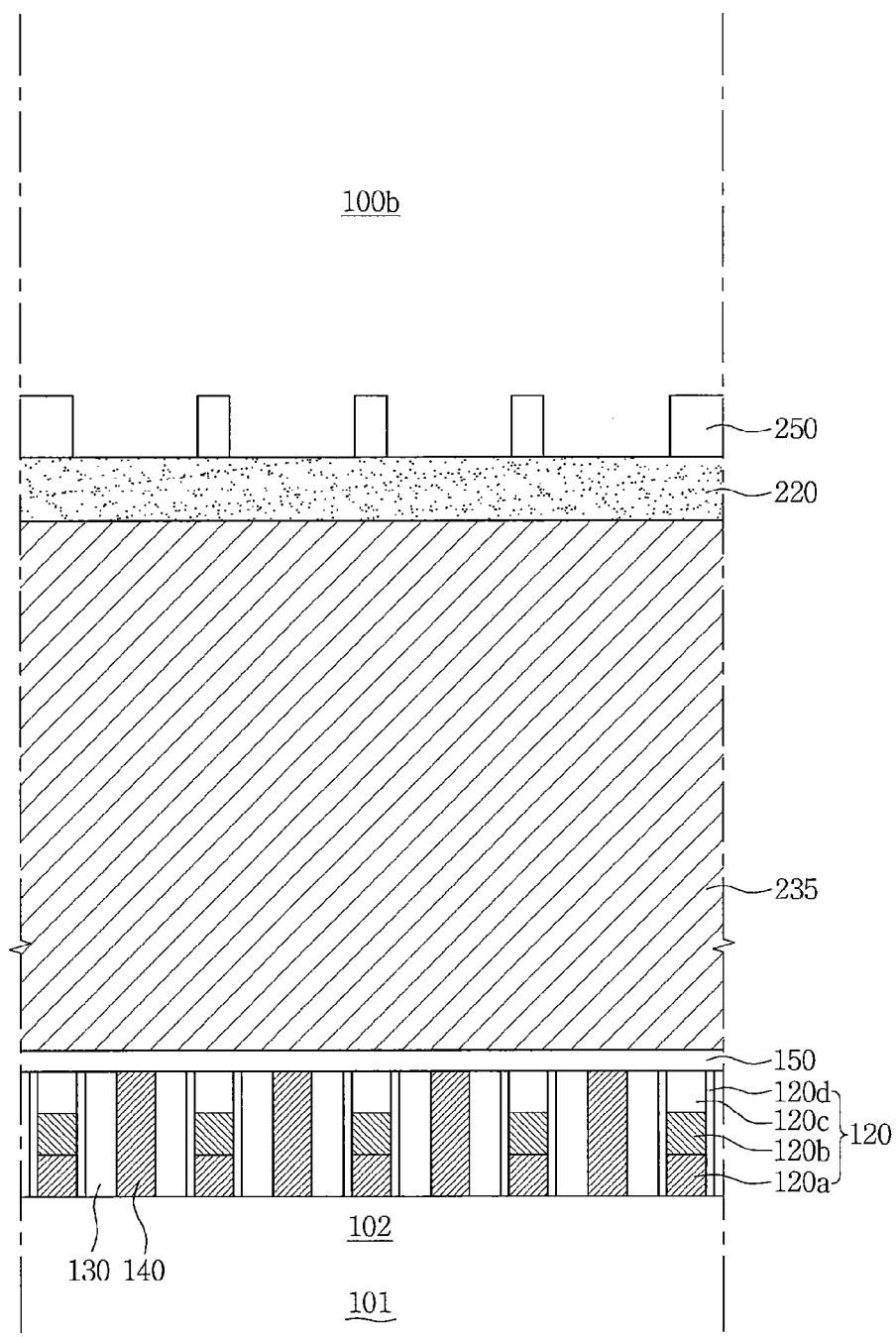
Figure 3B:
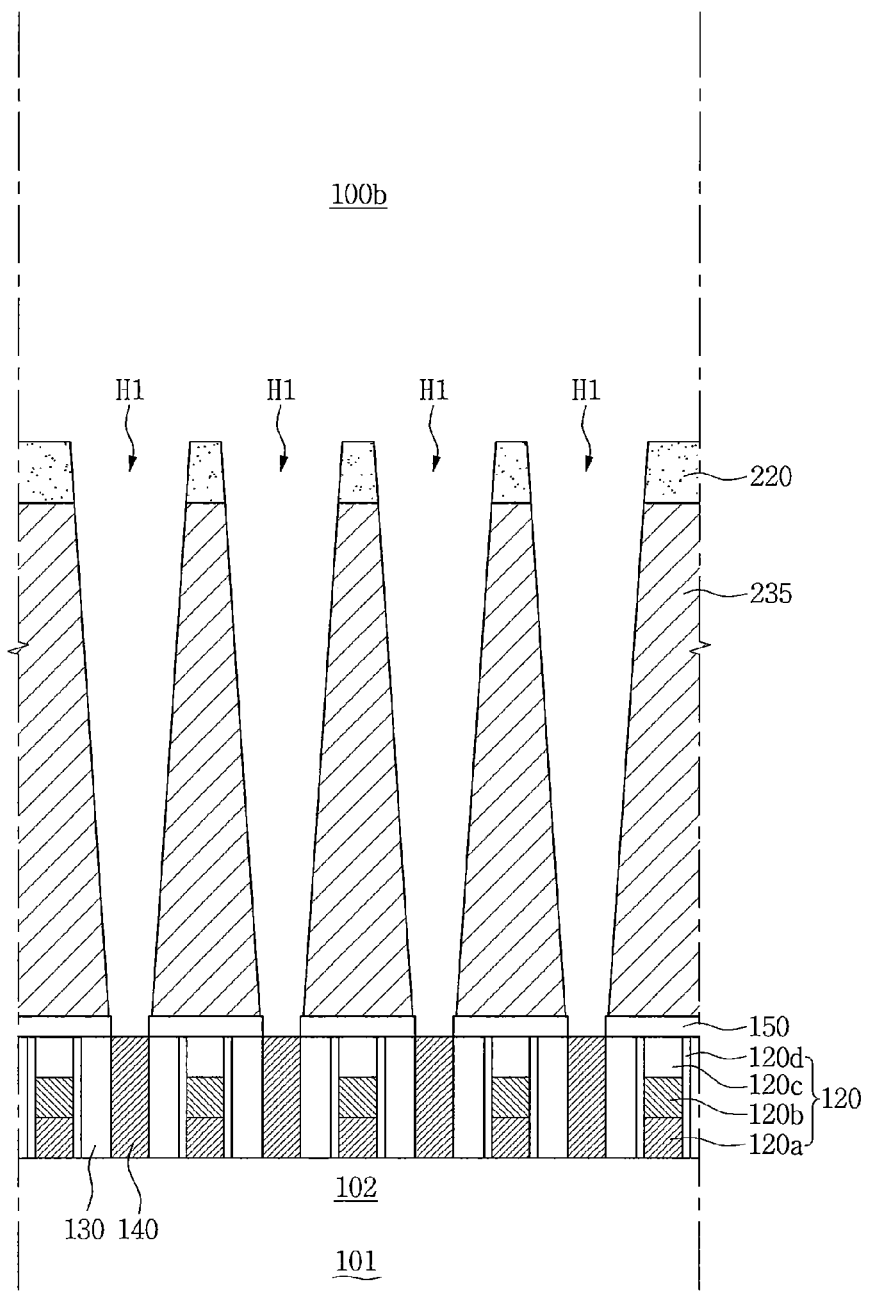

Referring to FIG. 3B, methods of fabricating semiconductor devices 100b in accordance with embodiments of the present inventive concepts may include a process of forming first holes H1 which expose upper surfaces of the contact pads 140 by selectively removing the upper supporter 220, the molding layer 235, and the stopping insulating layer 150 using the first mask pattern 250 as an etch mask, and a process of removing the first mask pattern 250.

Figure 3C:
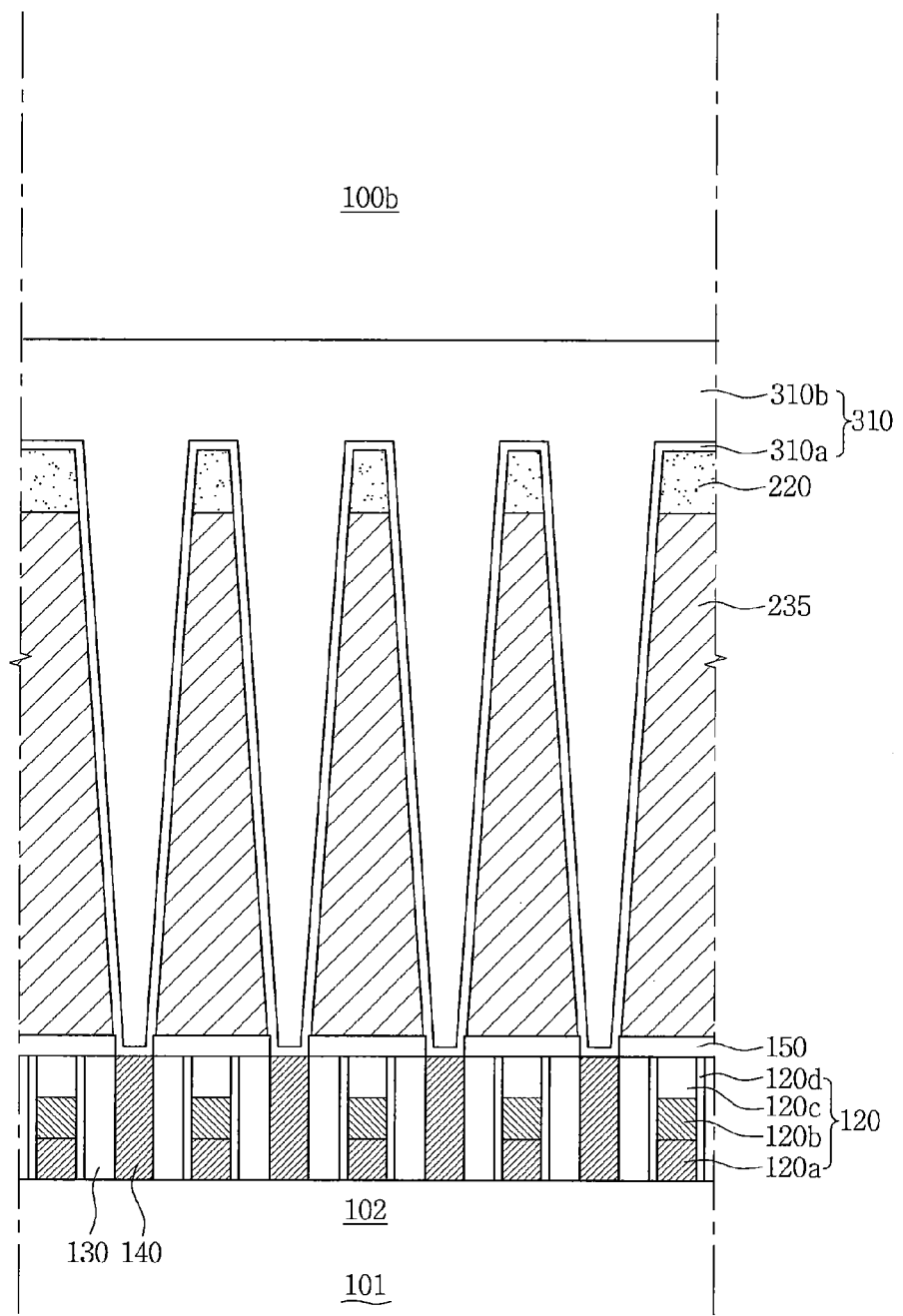

Referring to FIG. 3C, methods of fabricating semiconductor devices 100b in accordance with embodiments of the present inventive concepts may include a process of forming a storage electrode group 310 including a storage barrier layer 310a and a storage electrode 310b in the first holes H1.

The forming of the storage electrode group 310 may include any one of silicon, a silicide metal, and a metal compound. The storage electrode group 310 may be a lower electrode of a capacitor.

Figure 3D:
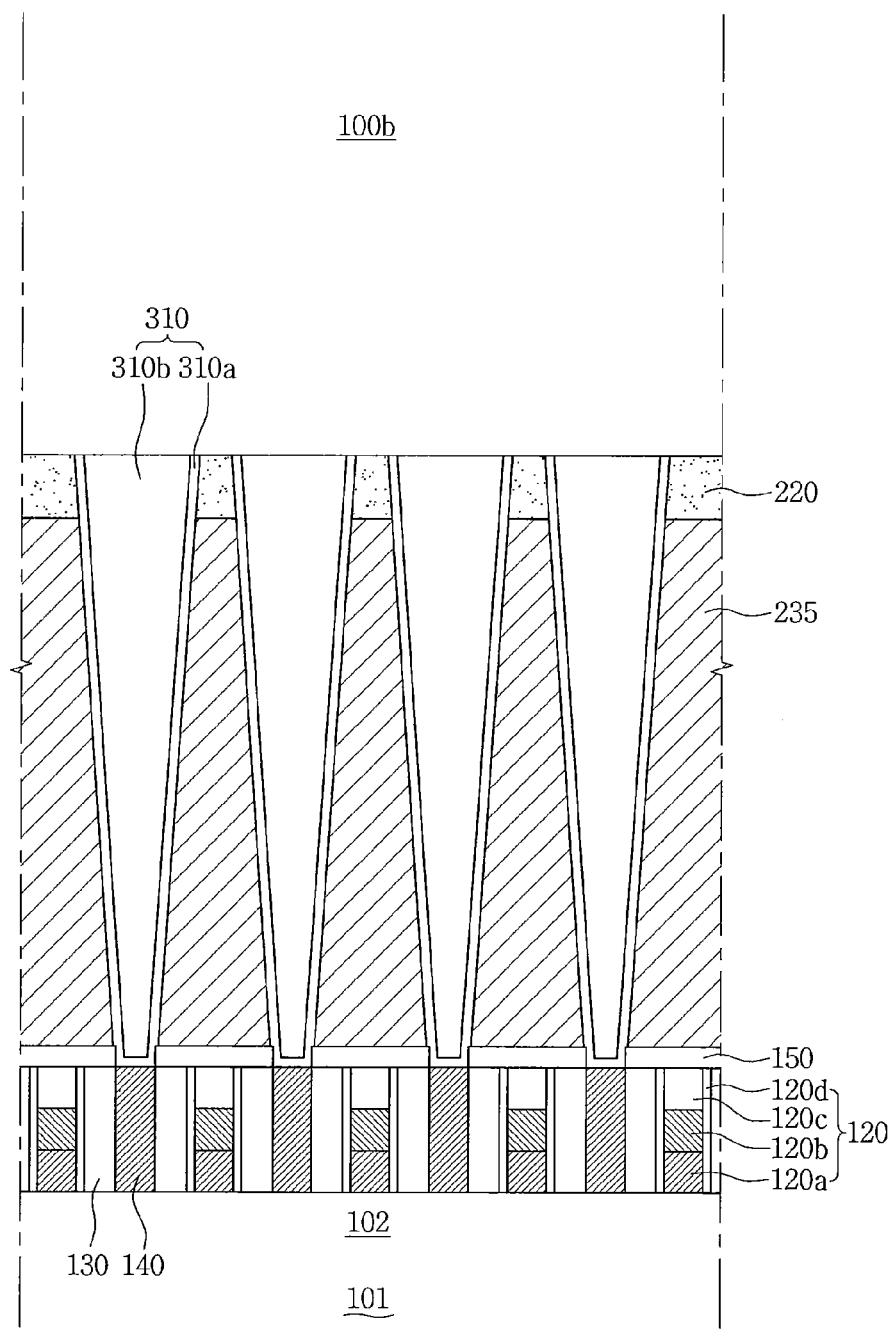

Referring to FIG. 3D, methods of fabricating semiconductor devices 100b in accordance with embodiments of the present inventive concepts may include a process of electrically and physically separating the storage electrode group by performing a planarization process such as a CMP process or an etch-back process.

Figure 3E:
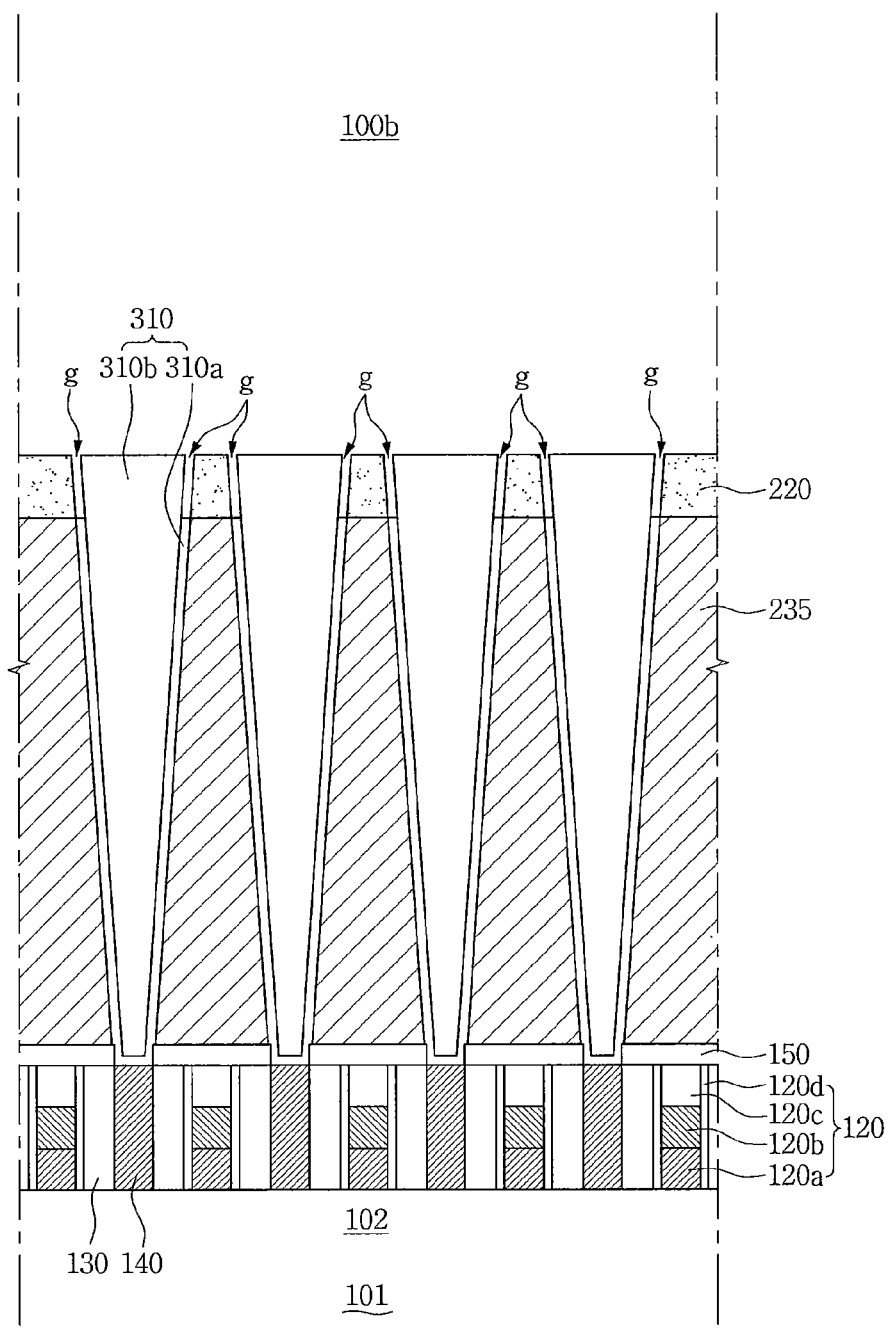

Referring to FIG. 3E, methods of fabricating semiconductor devices 100b in accordance with embodiments of the present inventive concepts may include a process of forming gap g between the storage electrodes 310b and the upper supporters 220 by partially removing upper parts of the storage barrier layer 310a. The process of partially removing upper parts of the storage barrier layer 310a may include a wet etching process using an etchant.

Figure 3F:
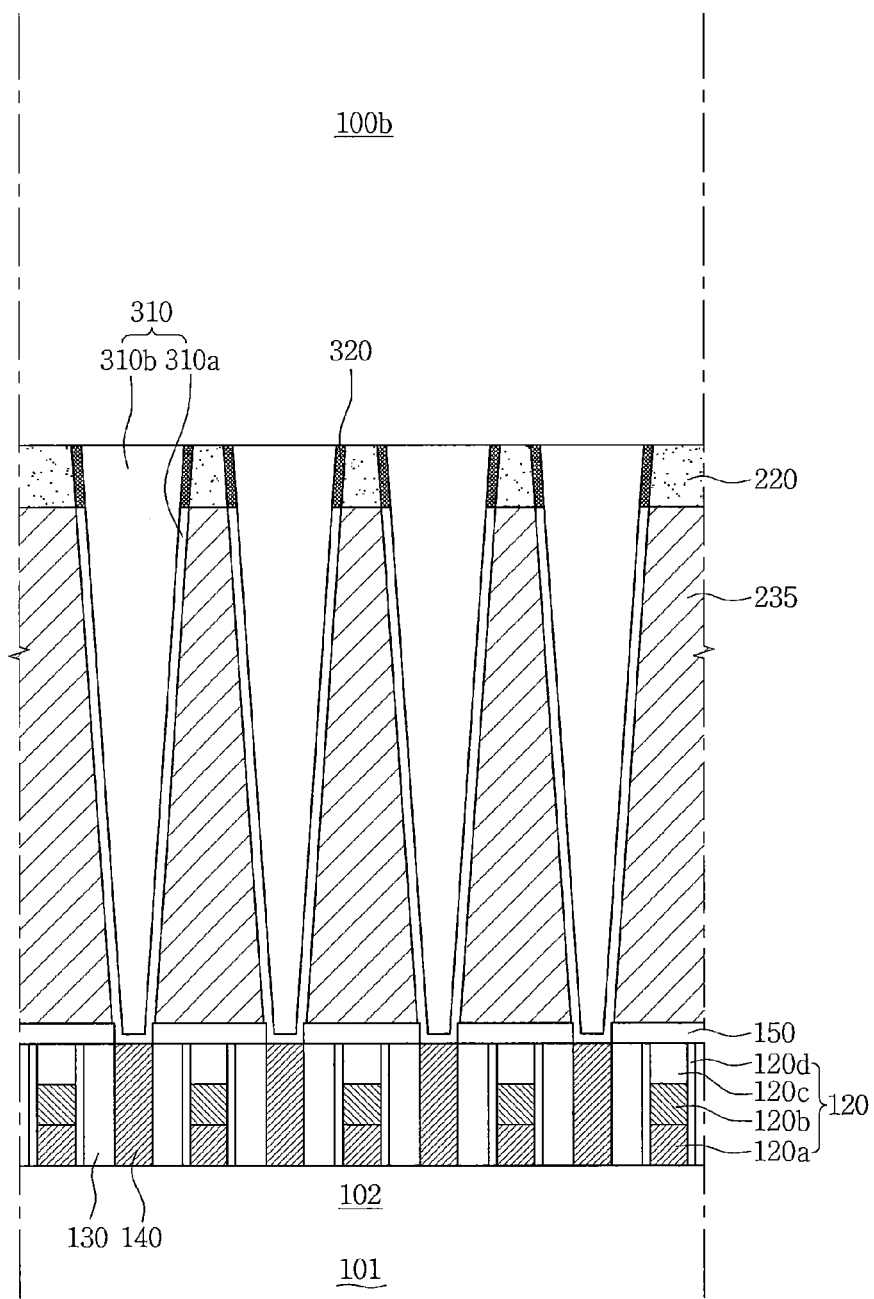

Referring to FIG. 3F, methods of fabricating semiconductor devices 100b in accordance with embodiments of the present inventive concepts may include a process of forming side supporters 320 in the gaps g.

The process of forming side supporters 320 may include a process of forming a silicon nitride layer on a side surface of the upper supporters 220, in which the storage barrier layer 310a was removed, by performing a deposition process.

Figure 3G:
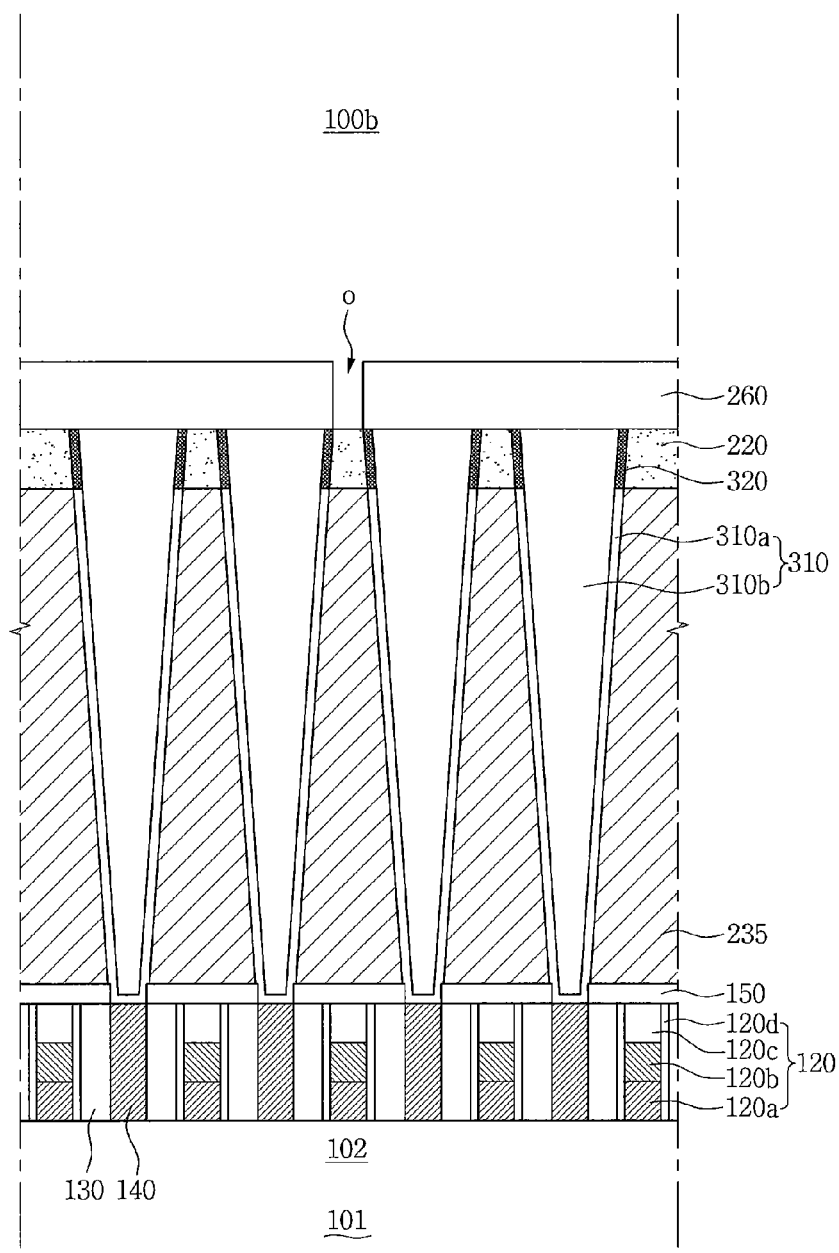

Referring to FIG. 3G, methods of fabricating semiconductor devices 100b in accordance with embodiments of the present inventive concepts may include a process of forming a second mask pattern 260 on the storage electrodes 310b, the upper supporters 220, and the side supporters 320.

The second mask pattern 260 may have an opening O which selectively exposes the upper surfaces of some of the upper supporters 220.

Figure 3H:
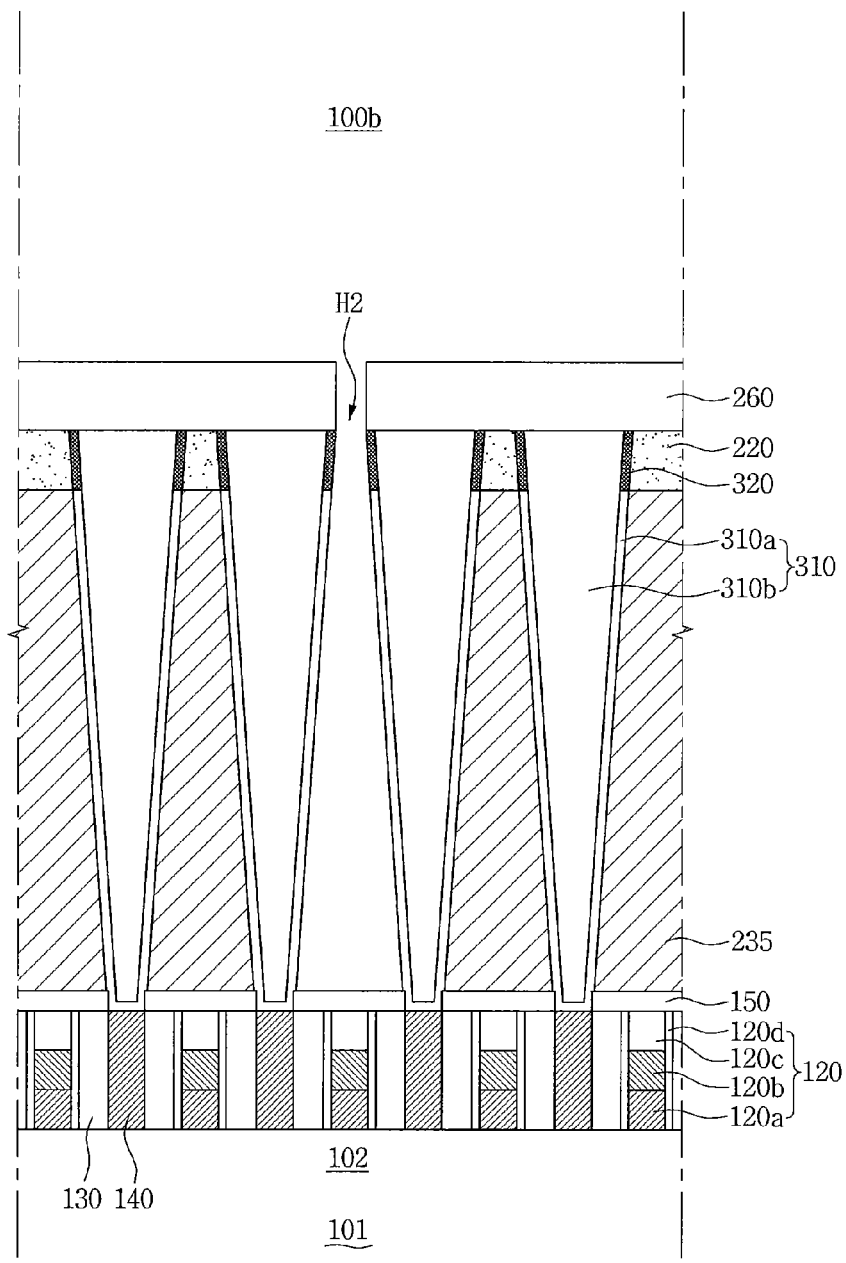

Referring to FIG. 3H, methods of fabricating semiconductor devices 100b in accordance with embodiments of the present inventive concepts may include a process of forming a second hole H2 which exposes the stopping insulating layer 150 by selectively removing the upper supporters 220 and the molding layer 235 using the second mask pattern 260 as an etch mask, and a process of removing the second mask pattern 260. An upper surface of the stopping insulating layer 150, side surfaces of the side supporters 320 and side surfaces of the storage barrier layer 310a may be exposed in the second hole H2.

Figure 3I:
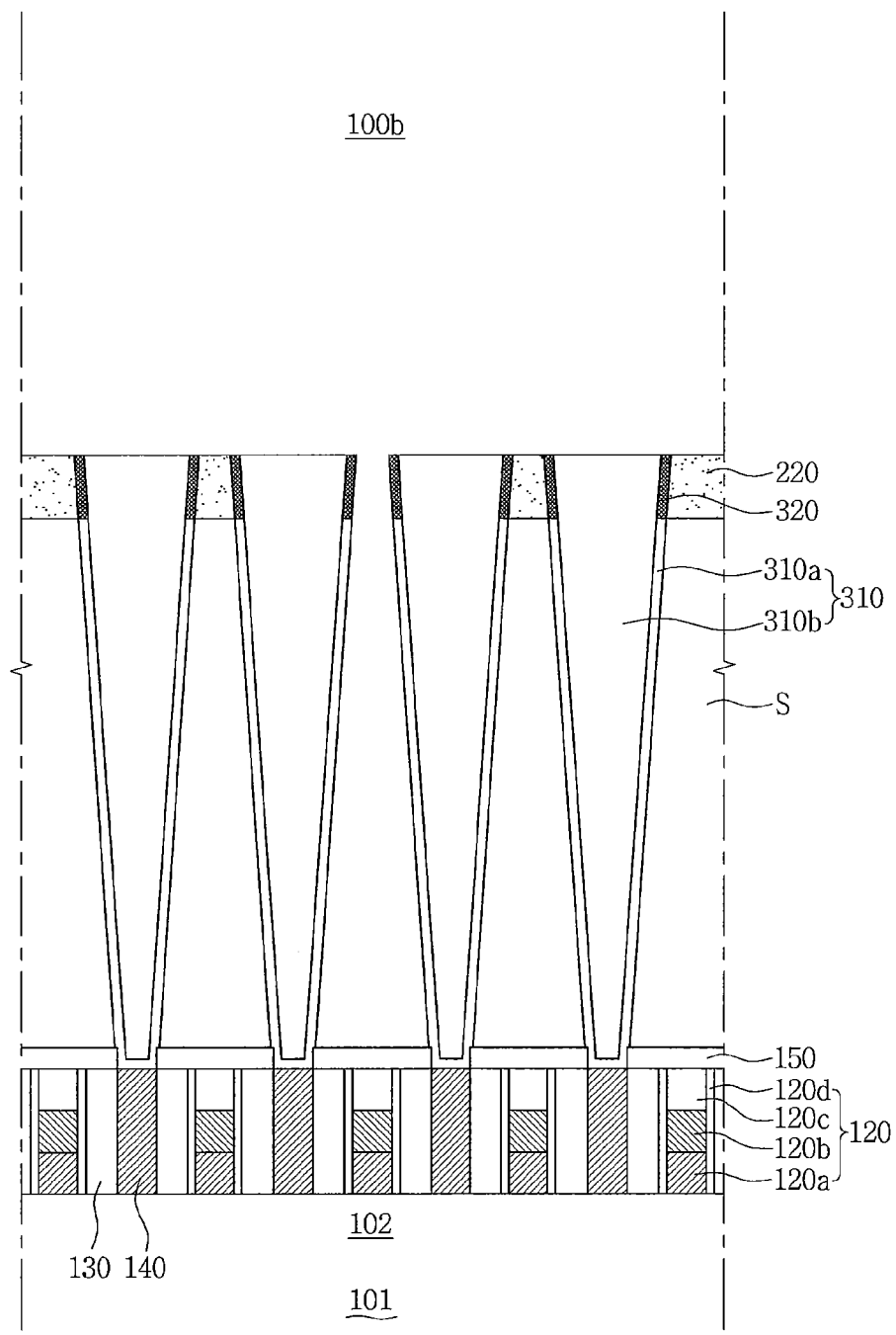

Referring to FIG. 3I, methods of fabricating semiconductor devices 100b in accordance with embodiments of the present inventive concepts may include a process of removing the molding layer 235.

A space S which exposes the upper surface of the stopping insulating layer 150 and side surfaces of the storage barrier layer 310a may be formed by the process of removing the molding layer 235.

Figure 3J:
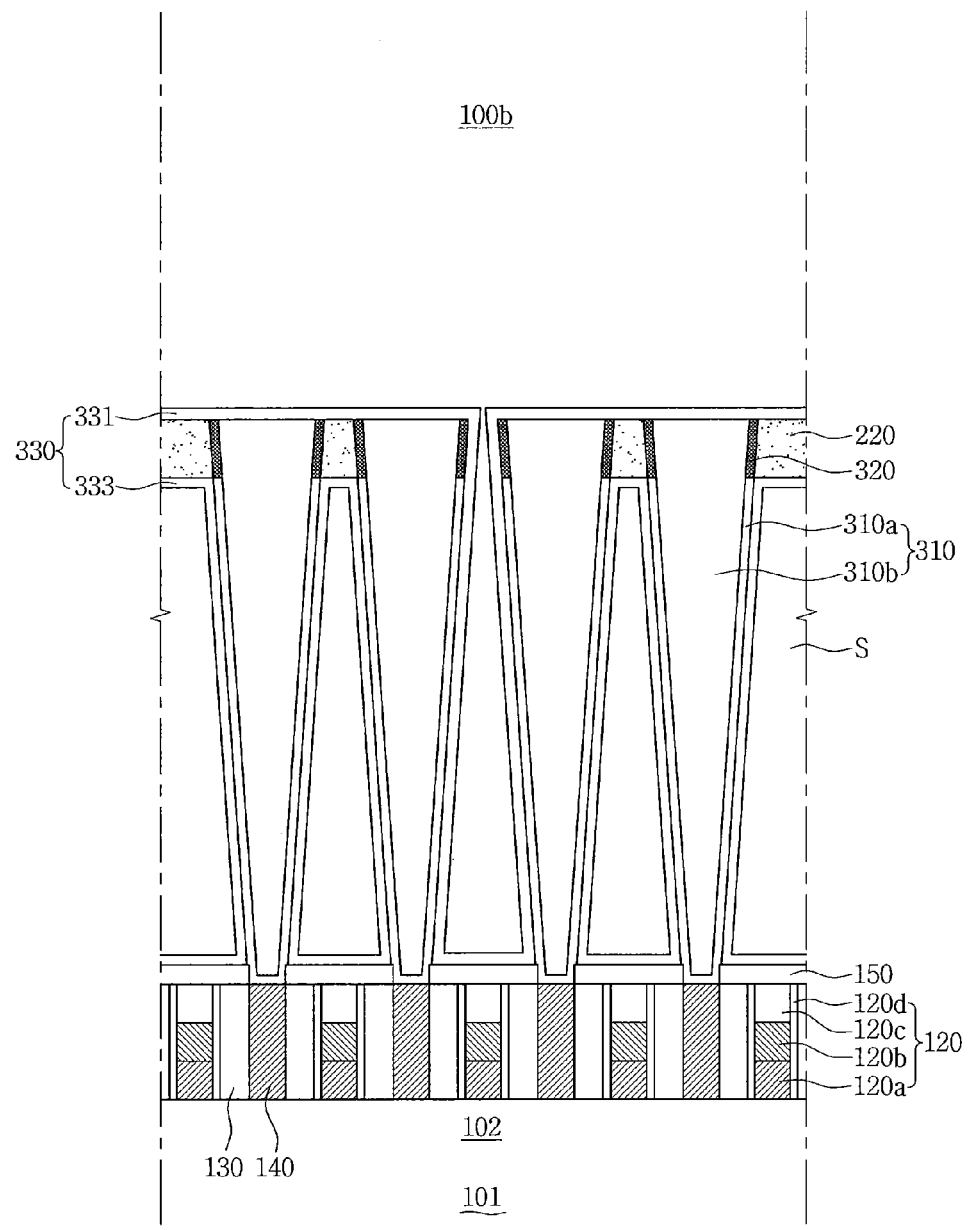

Referring to FIG. 3J, methods of fabricating semiconductor devices 100b in accordance with embodiments of the present inventive concepts may include a process of conformally forming a capacitor dielectric layer 330 on the surfaces of the storage barrier layers 310a, the stopping insulating layer 150, and the upper supporters 220 exposed by the space S.

The capacitor dielectric layer 330 may include an upper capacitor dielectric layer 331 and a lower capacitor dielectric layer 333. The upper capacitor dielectric layer 331 may be formed on upper surfaces of the upper supporters 220 and upper surfaces of the side supporters 320. The lower capacitor dielectric layer 333 may be formed on lower surfaces of the upper supporters 220, an upper surface of the stopping insulating layer 150, and side surfaces of the storage barrier layers 310a.

Referring to FIG. 1B, methods of fabricating semiconductor devices 100b in accordance with embodiments of the present inventive concepts may include a process of forming a plate electrode 340 on the capacitor dielectric layer 330, and a process of forming a capacitor capping layer 350 on the plate electrode 340.

The plate electrode 340 may act as an upper electrode of a capacitor. The plate electrode 340 may include an upper plate electrode 341 and a lower plate electrode 343.

The process of forming the plate electrode 340 may include a process of conformally forming a barrier metal layer such as titanium nitride (TiN) on the capacitor dielectric layer 330. The process of forming the plate electrode 340 may include a process of forming a barrier metal layer such as titanium nitride (TiN) to fill the space S.

FIGS. 4A to 4K are cross-sectional views illustrating methods of fabricating semiconductor devices in accordance with embodiments of the present inventive concepts.

Method of fabricating semiconductor devices in accordance with embodiments of the present inventive concepts will now be explained with reference to FIGS. 1C and 4A to 4K. First referring to FIG. 4A, methods of fabricating semiconductor devices 100c in accordance with embodiments of the present inventive concepts may include a process of forming bit line structures 120, an interlayer insulating layer 130 and contact pads 140 on an active area 102 of a substrate 101, and a process of sequentially forming a stopping insulating layer 150, a lower molding layer 205, a lower supporter 210, an upper molding layer 215, and a first mask pattern 250 on the bit line structures 120, the interlayer insulating layer 130 and the contact pads 140.

Figure 4A:
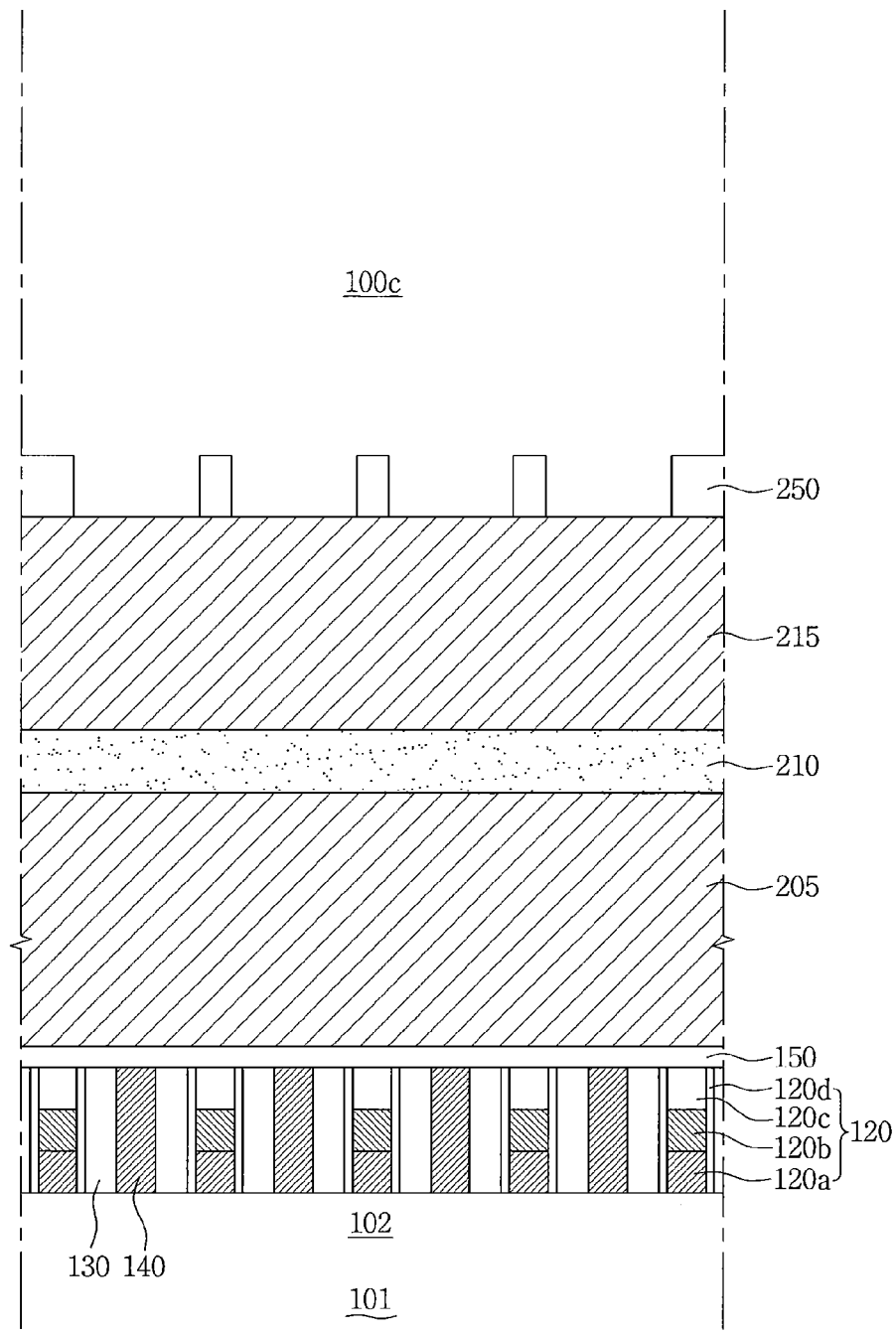
Figure 4B:
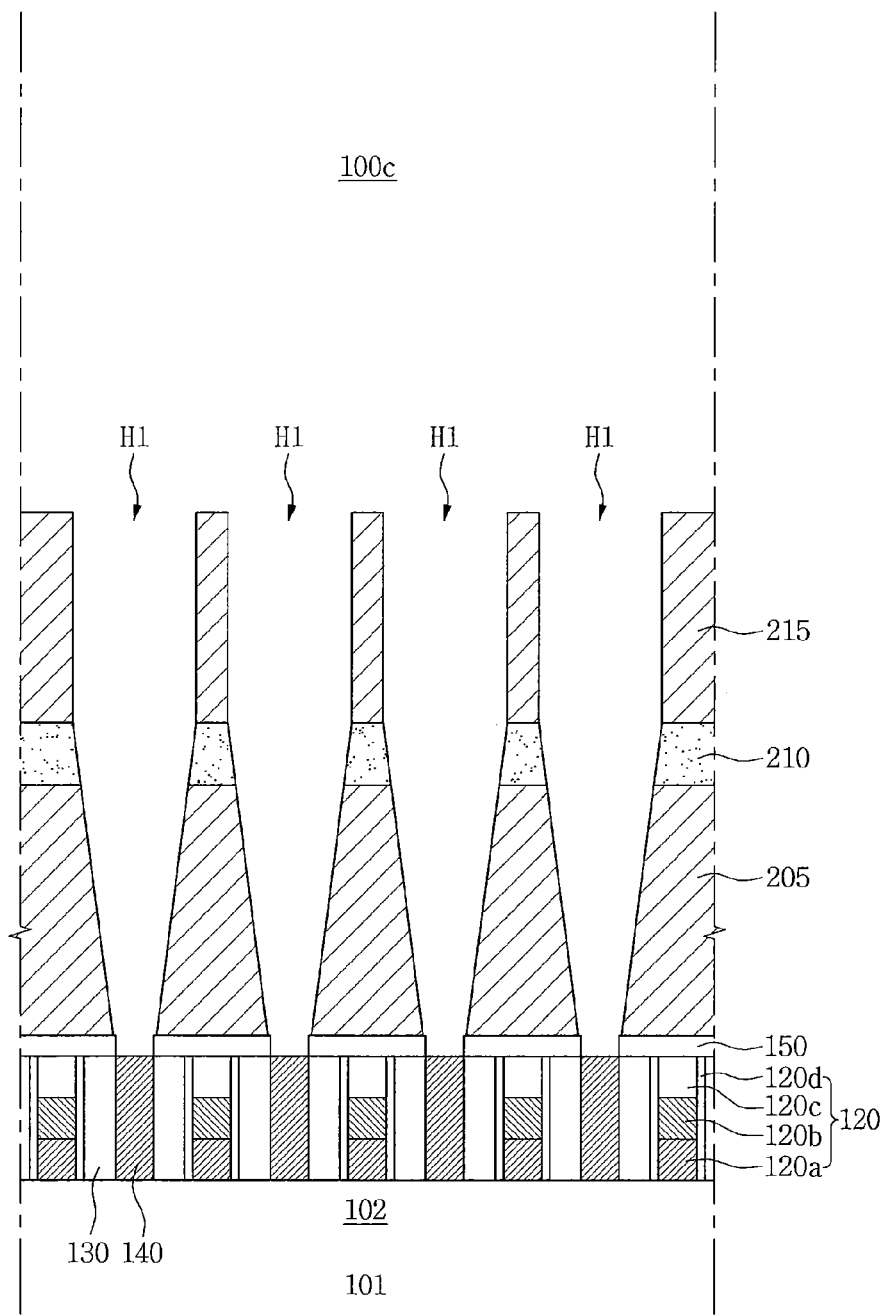

Referring to FIG. 4B, methods of fabricating semiconductor devices 100c in accordance with embodiments of the present inventive concepts may include a process of forming first holes H1 which expose upper surfaces of the contact pads 140 by selectively removing the upper molding layer 215, the lower supporter 210, the lower molding layer 205, and the stopping insulating layer 150 using the first mask pattern 250 as an etch mask, and a process of removing the first mask pattern 250.

Figure 4C:
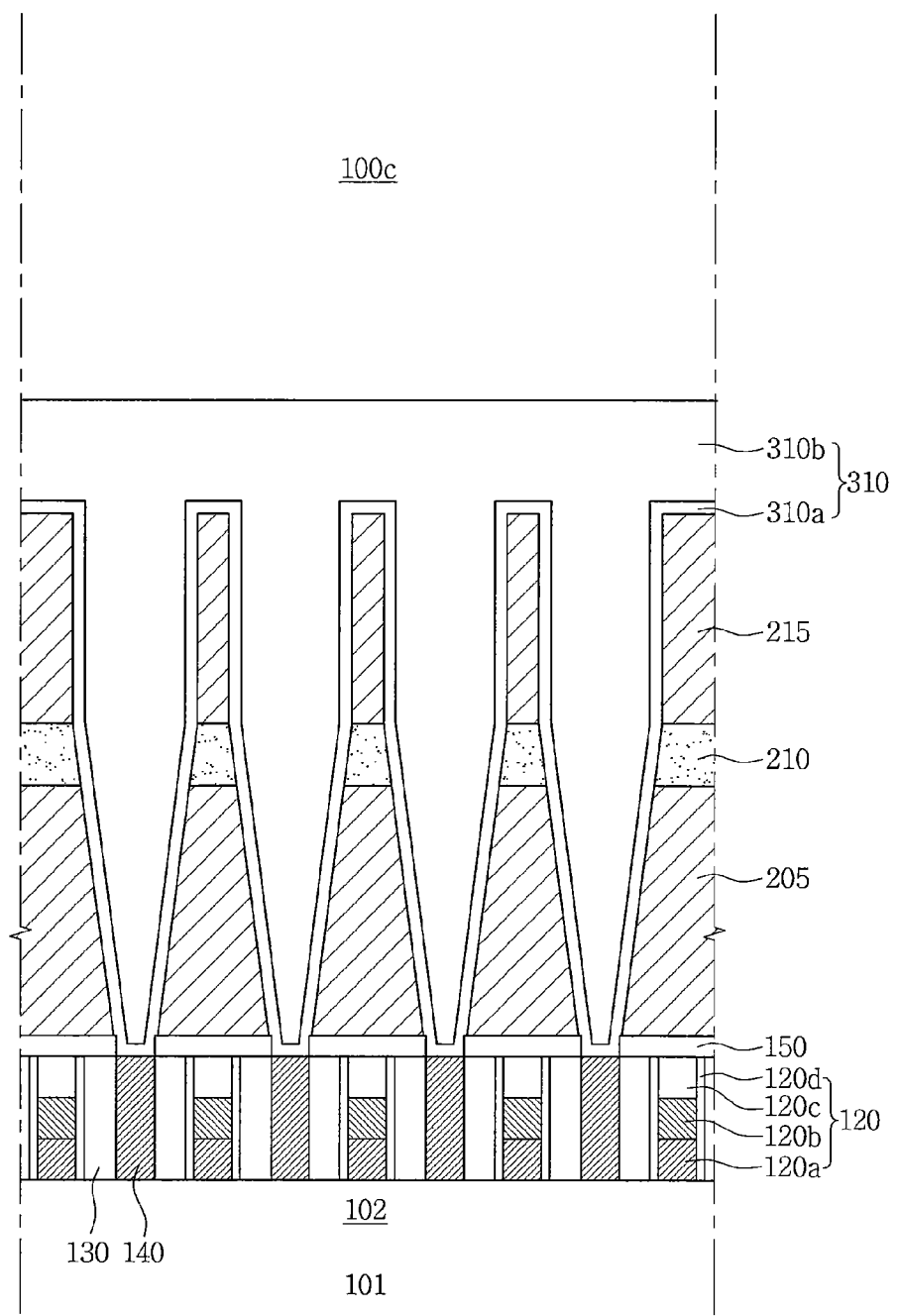

Referring to FIG. 4C, methods of fabricating semiconductor devices 100c in accordance with embodiments of the present inventive concepts may include a process of forming a storage electrode group 310 including a storage barrier layer 310a and a storage electrode 310b in the first holes H1.

The forming of the storage barrier layer 310a and the storage electrode 310b may include any one of silicon, a silicide metal, and a metal compound. The storage electrode group 310 may be a lower electrode of a capacitor.

Figure 4D:
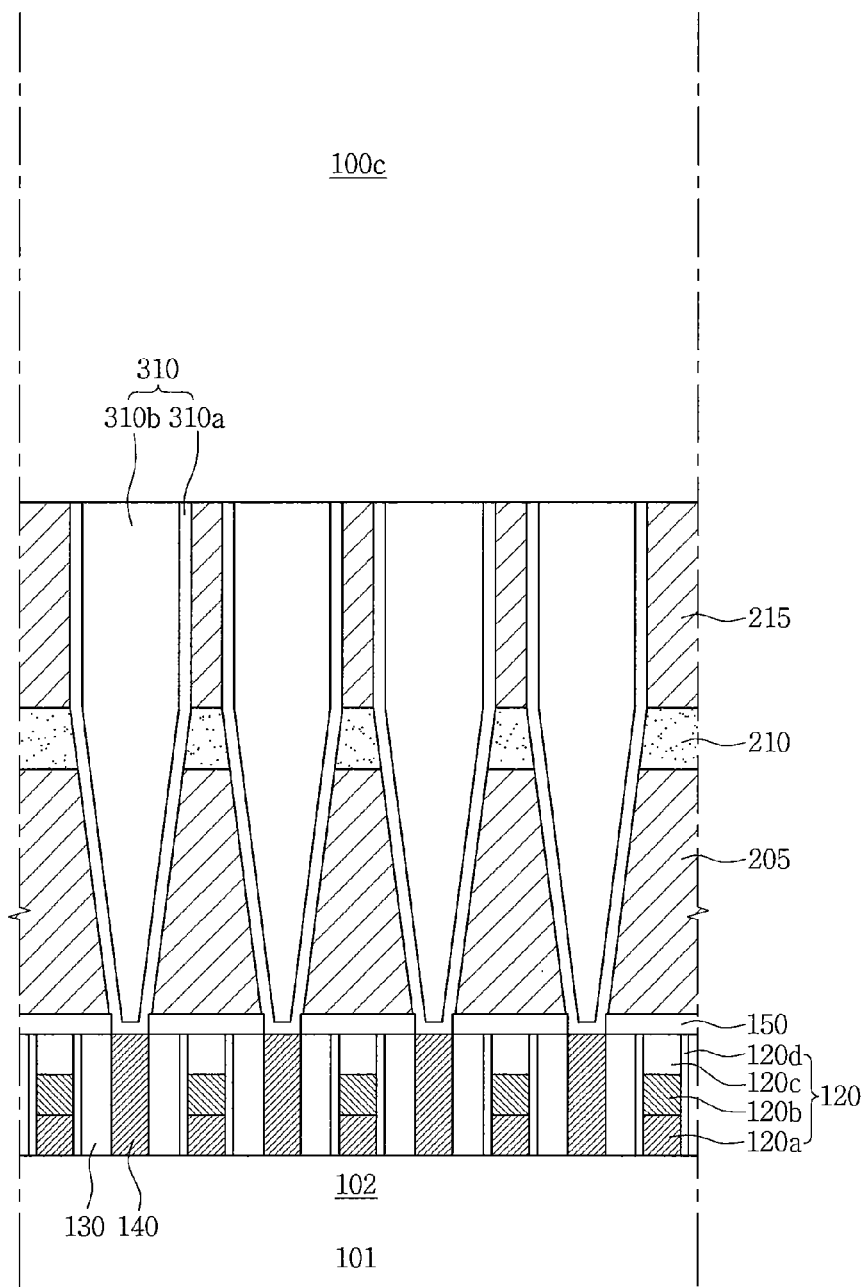

Referring to FIG. 4D, methods of fabricating semiconductor devices 100c in accordance with embodiments of the present inventive concepts may include a process of electrically and physically separating the storage electrode group 310 by performing a planarization process such as a CMP process or an etch-back process.

Figure 4E:
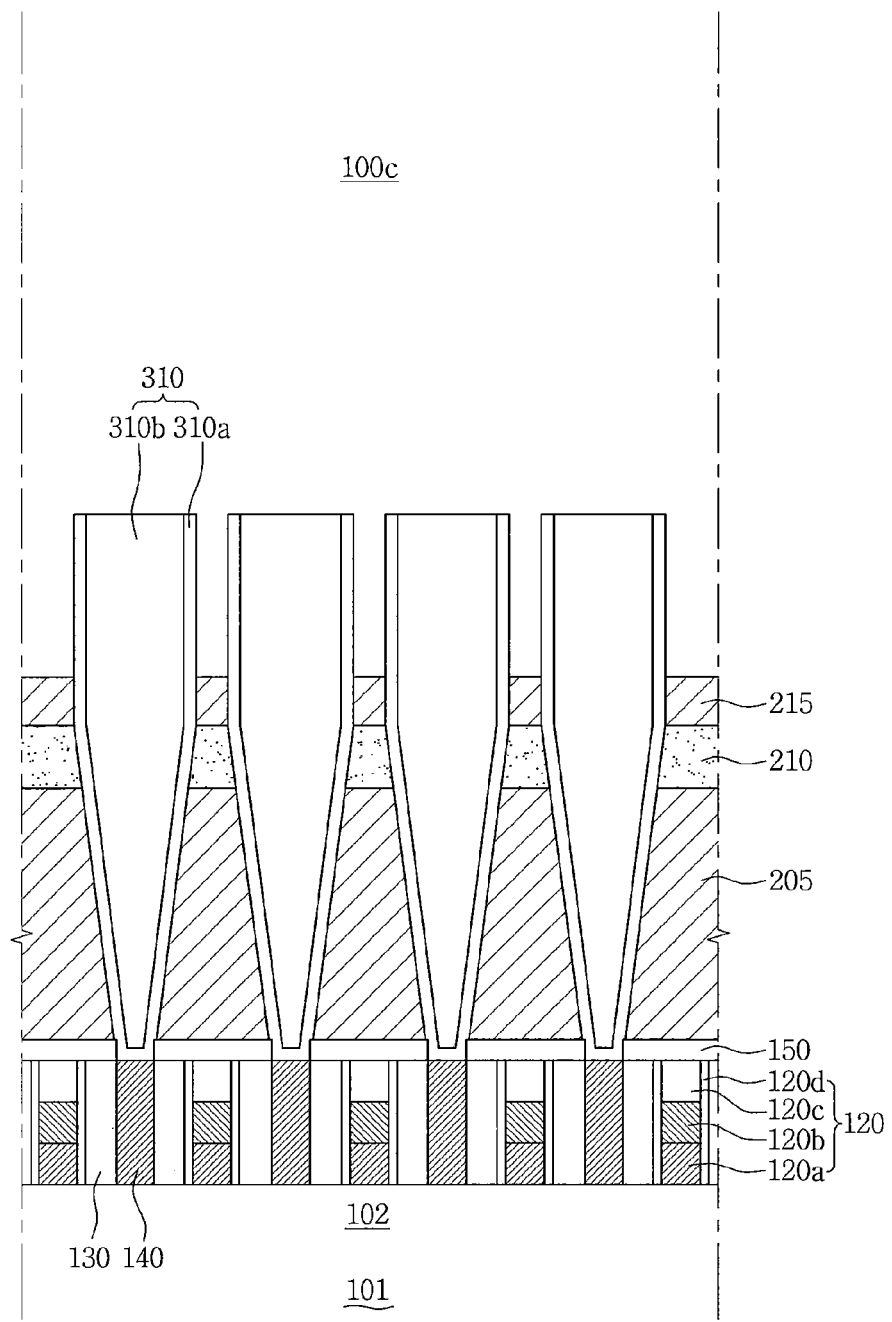

Referring to FIG. 4E, methods of fabricating semiconductor devices 100c in accordance with embodiments of the present inventive concepts may include a process of partially removing an upper part of the upper molding layer 215.

Parts of side surfaces of the storage barrier layer 310a may be exposed by the process of partially removing an upper part of the upper molding layer 215.

Figure 4F:
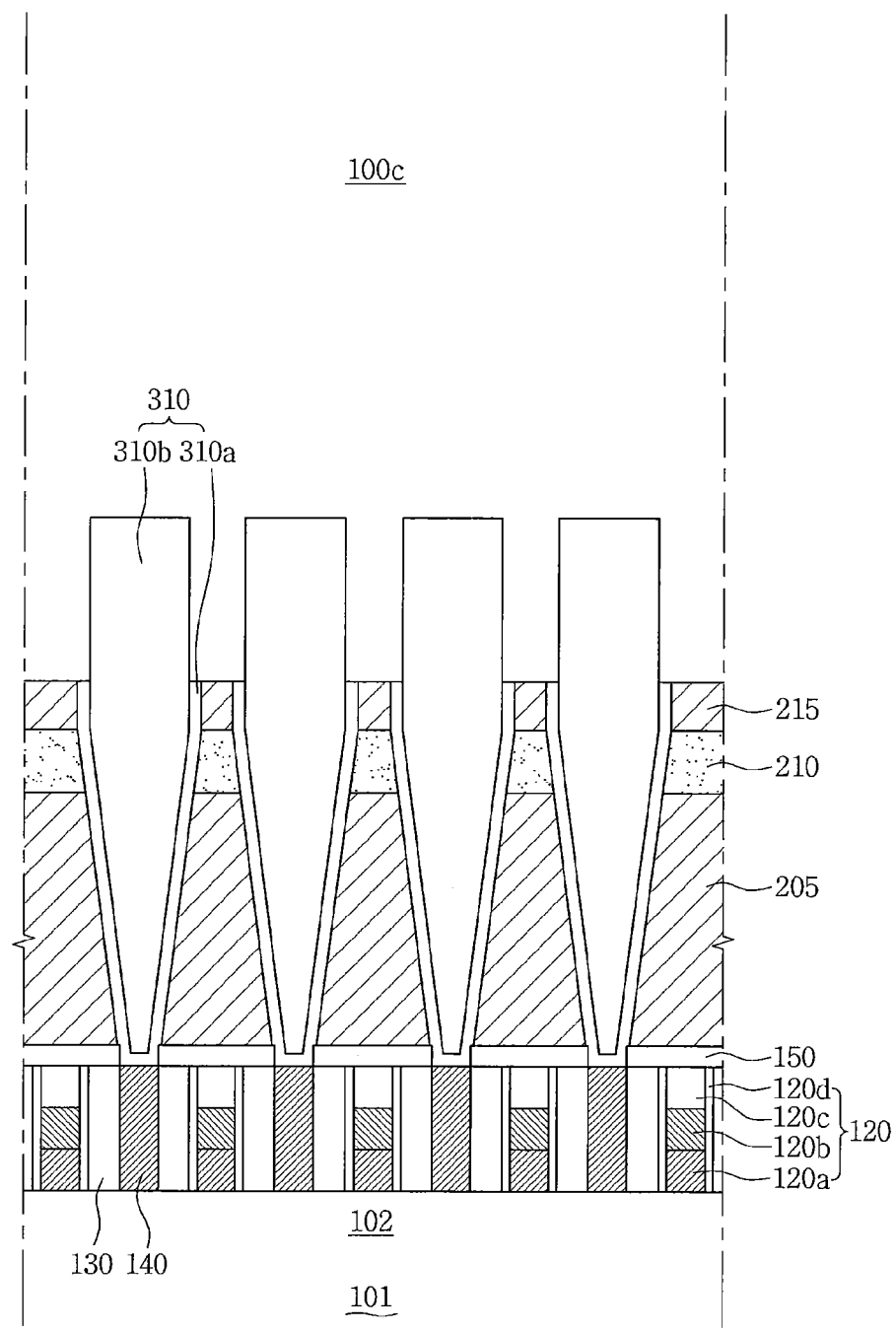

Referring to FIG. 4F, methods of fabricating semiconductor devices 100c in accordance with embodiments of the present inventive concepts may include a process of removing the exposed parts of the storage barrier layer 310a.

Parts of side surfaces of the storage electrode 310b may be exposed by the process of removing the exposed parts of the storage barrier layer 310a.

Figure 4G:
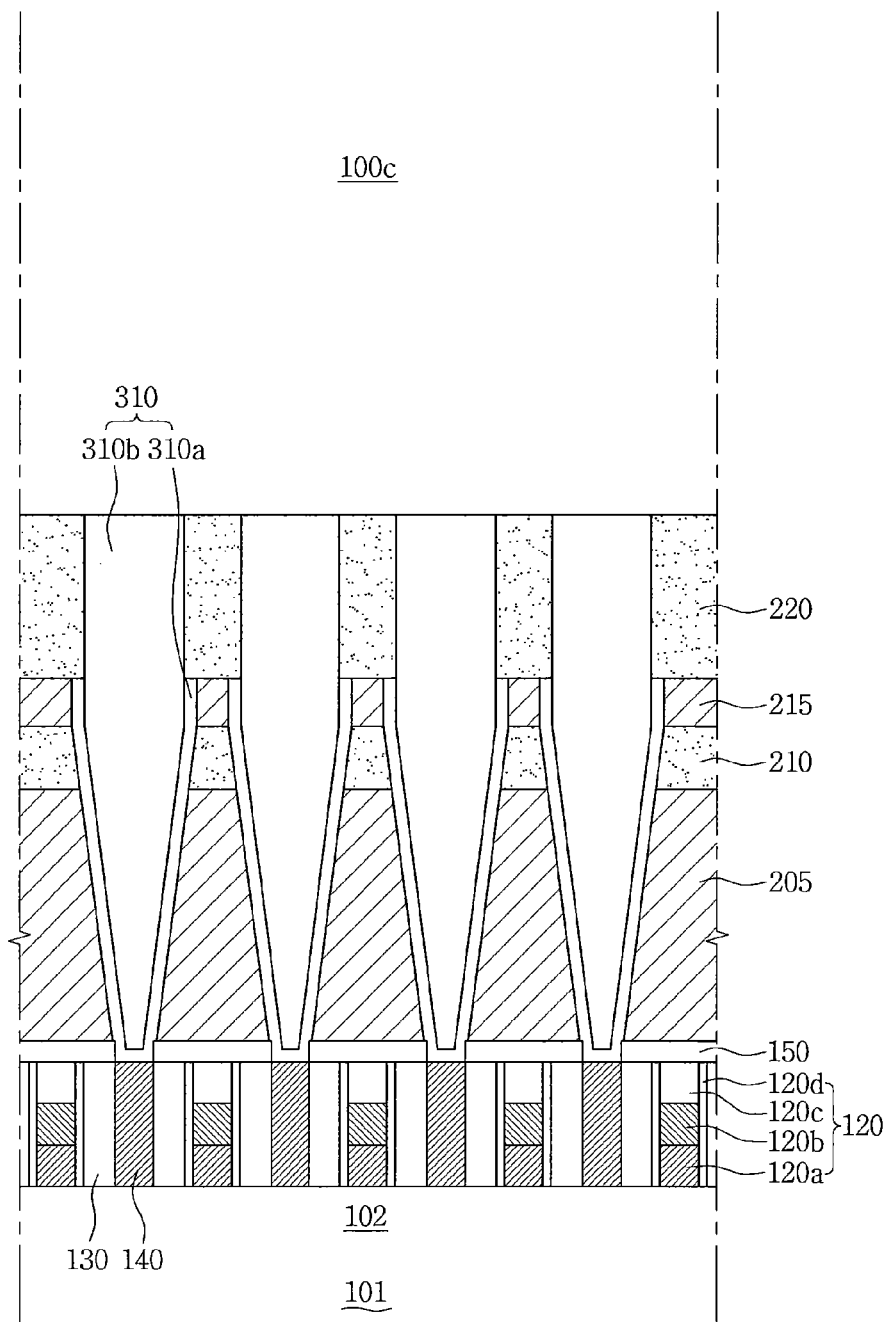

Referring to FIG. 4G, methods of fabricating semiconductor devices 100c in accordance with embodiments of the present inventive concepts may include a process of forming upper supporters 220 on the upper molding layer 215 and the storage barrier layer 310a.

The upper supporter 220 may include the same material as the lower supporter 210. An upper surface of the upper supporter 220 may be planarized to be coplanar with an upper surface of the storage electrode 310b.

Figure 4H:
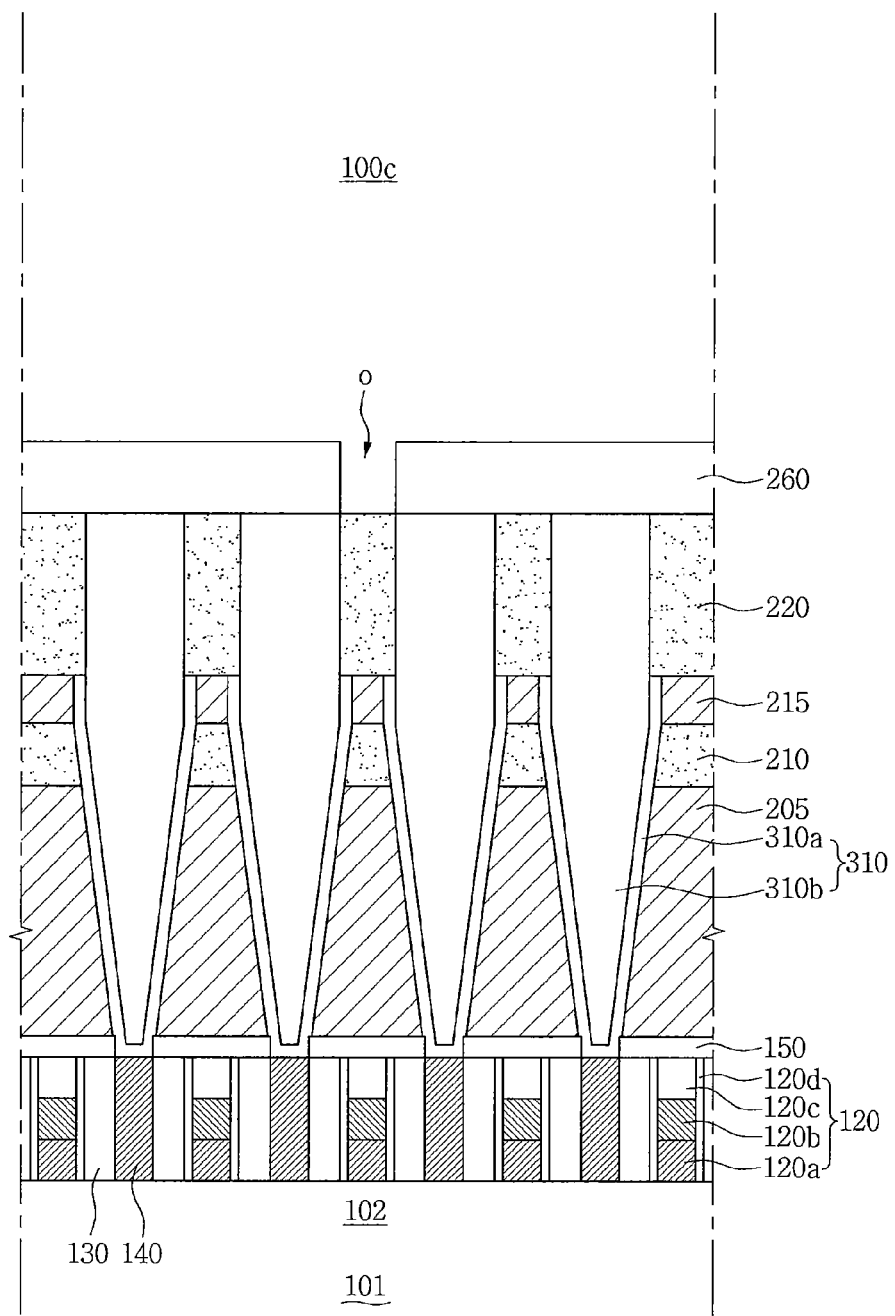

Referring to FIG. 4H, methods of fabricating semiconductor devices 100c in accordance with embodiments of the present inventive concepts may include a process of forming a second mask pattern 260 on the upper supporters 220 and the storage electrodes 310b.

The second mask pattern 260 may have an opening O, which exposes a part of the upper supporter 220 between the storage electrodes 310b.

Figure 4I:
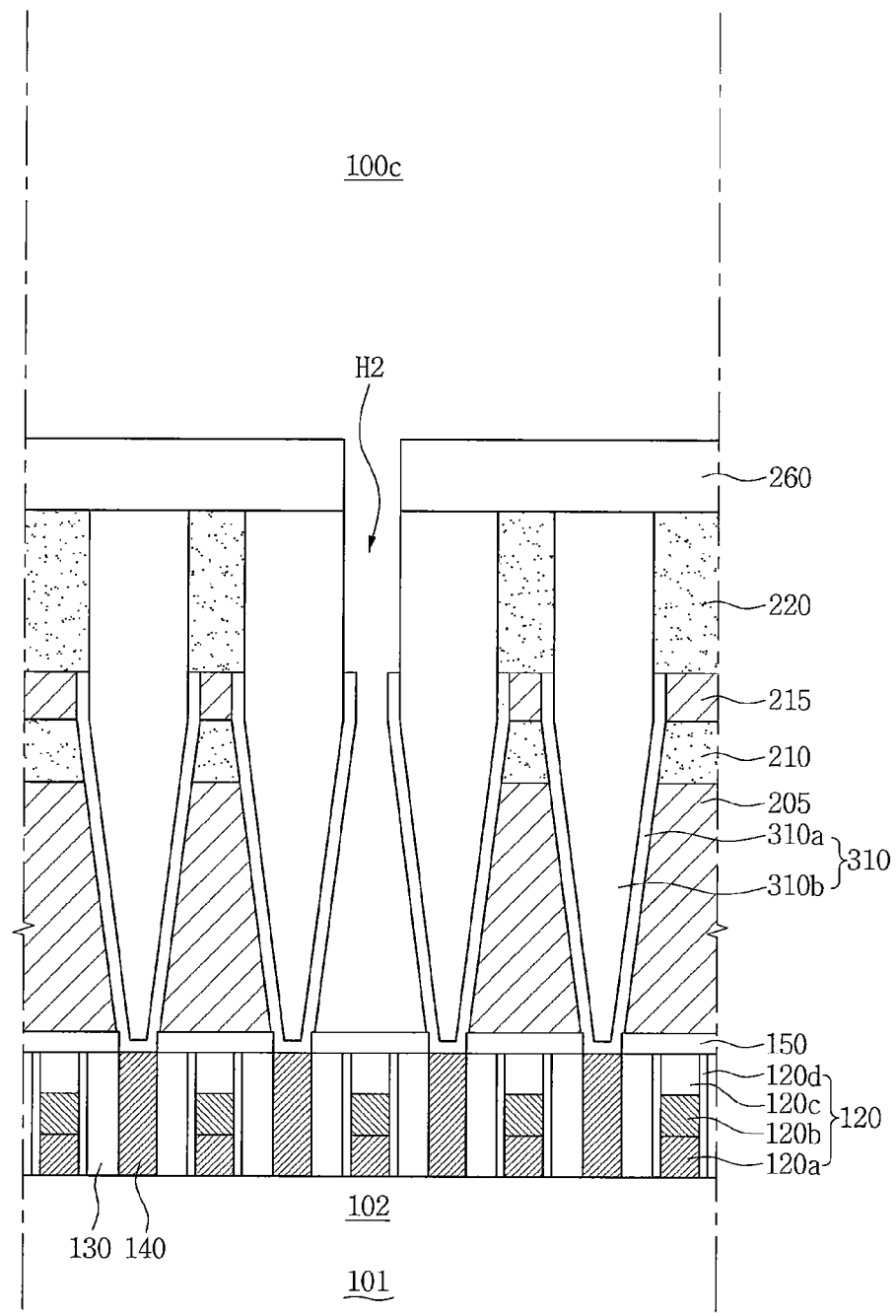

Referring to FIG. 4I, methods of fabricating semiconductor devices 100c in accordance with embodiments of the present inventive concepts may include a process of forming a second hole H2 which exposes an upper surface of the stopping insulating layer 150, and side surfaces of the storage barrier layer 310a and the storage electrode 310b by selectively removing the upper supporter 220, the upper molding layer 215, the lower supporter 210, and the lower molding layer 205 using the second mask pattern 260 as an etch mask, and a process of removing the second mask pattern 260.

Figure 4J:
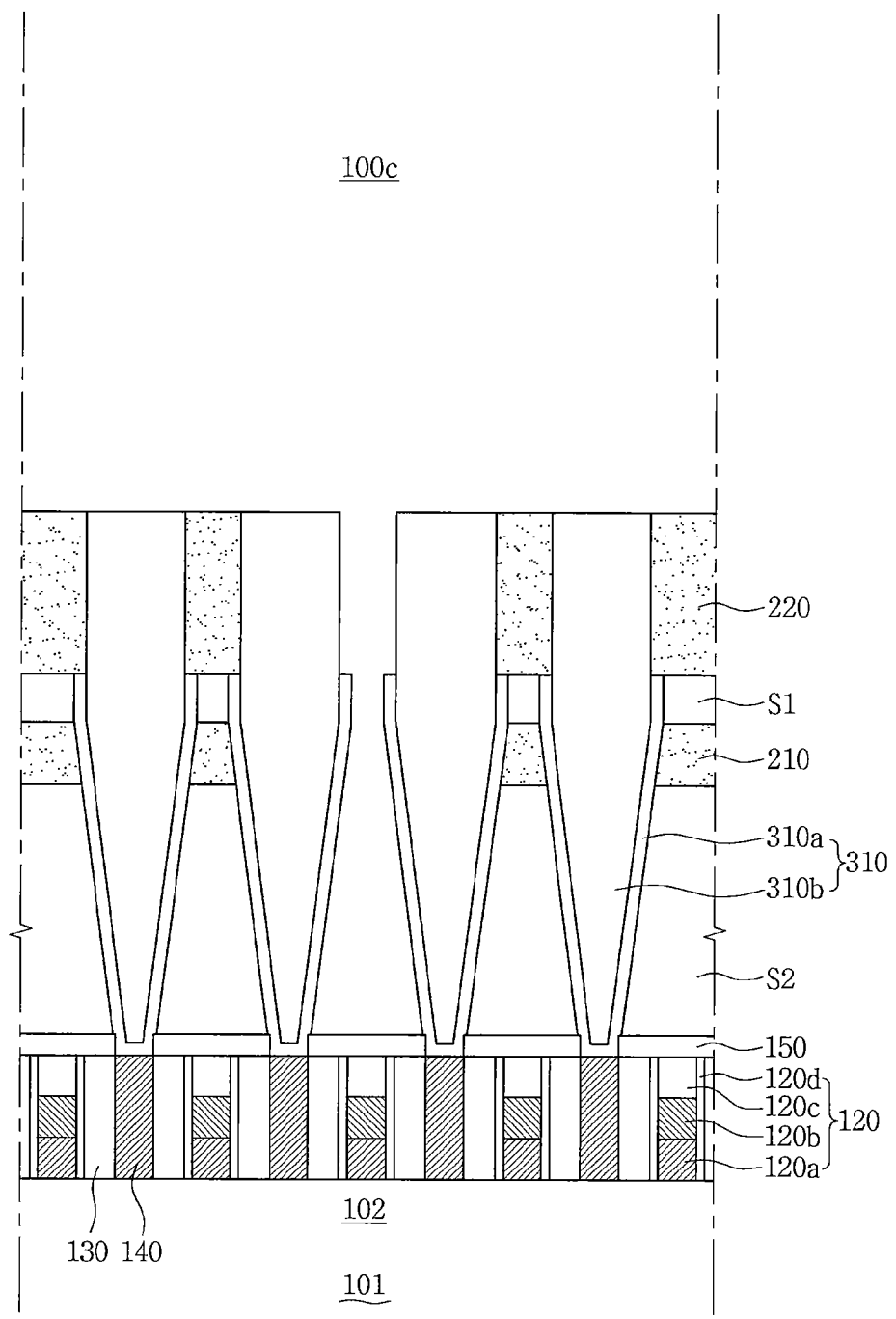

Referring to FIG. 4J, methods of fabricating semiconductor devices 100c in accordance with embodiments of the present inventive concepts may include a process of forming an upper space S1 and a lower space S2 by removing the upper molding layer 215 and the lower molding layer 205.

Figure 4K:
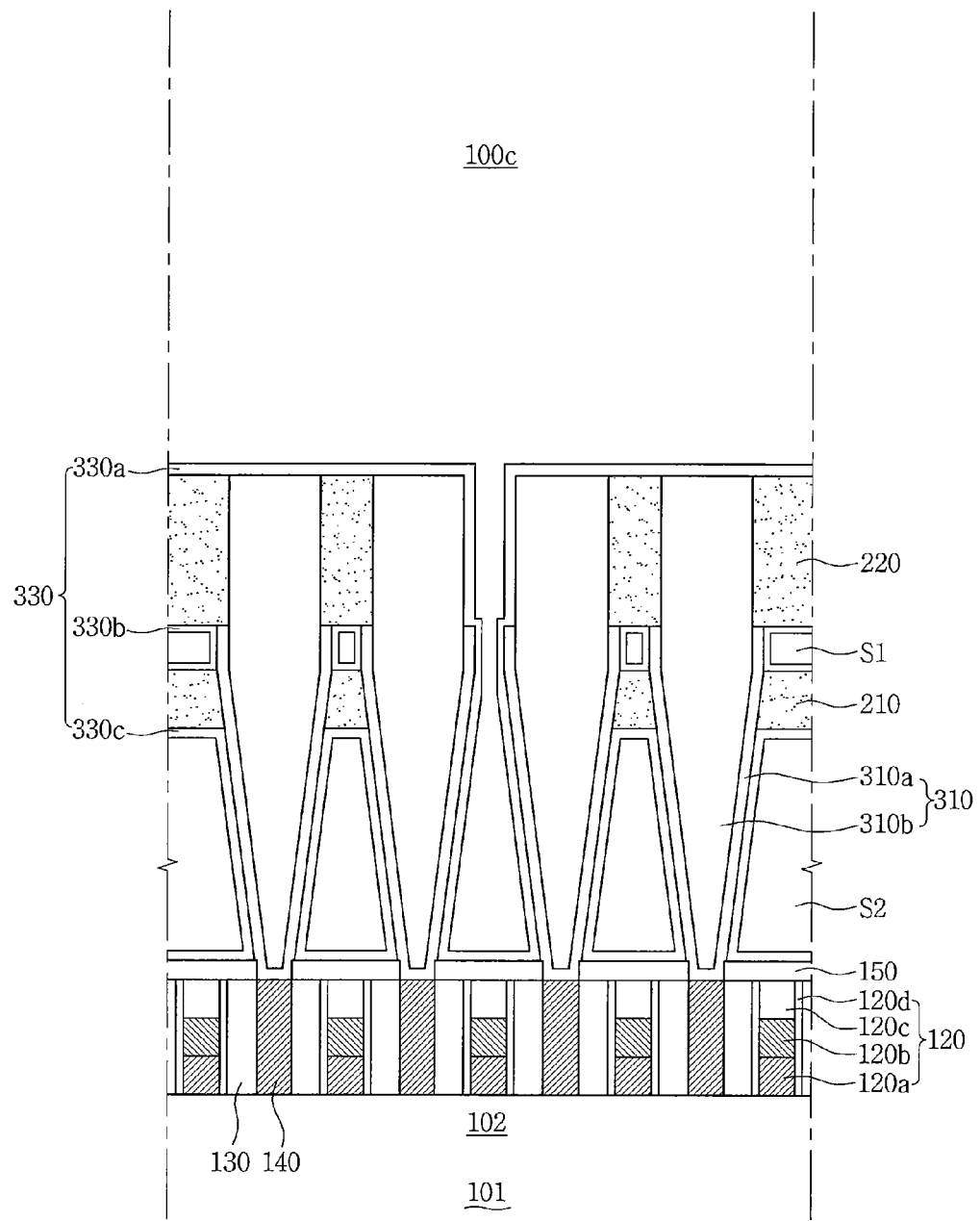

Referring to FIG. 4K, methods of fabricating semiconductor devices 100c in accordance with embodiments of the present inventive concepts may include a process of forming a capacitor dielectric layer 330 on surfaces of the storage barrier layer 310a, the storage electrode 310b, and the upper supporter 220.

The capacitor dielectric layer 330 may include an upper capacitor dielectric layer 330a, and intermediate capacitor dielectric layer 330b, and a lower capacitor dielectric layer 330c. The upper capacitor dielectric layer 330a may be formed on an upper surface of the storage electrodes 310b, upper surfaces of the upper supporters 220, side surfaces of some of the storage electrodes 310b, and side surfaces of some of the storage barrier layers 310a. The intermediate capacitor dielectric layer 330b may be formed on a lower surface of the upper supporter 220, a side surface of an upper part of the storage barrier layer 310a, and an upper surface of the lower supporter 210. The lower capacitor dielectric layer 330c may be formed on a side surface of a lower part of the storage barrier layer 310a, a lower surface of the lower supporter 210, and on the stopping insulating layer 150.

Referring to FIG. 1C, methods of fabricating semiconductor devices 100c in accordance with embodiments of the present inventive concepts may include a process of forming a plate electrode 340 on the capacitor dielectric layer 330, and a process of forming a capacitor capping layer 350 on the plate electrode 340, such that a capacitor structure may be formed. The plate electrode 340 may be an upper electrode of a capacitor. The plate electrode 340 may include an upper plate electrode 341, an intermediate plate electrode 342, and a lower plate electrode 343.

With respect to the semiconductor devices in accordance with the present inventive concepts, since the supporters between the storage electrodes have greater widths, a possibility of a short circuit between the electrodes can be reduced and a vertical characteristic of the electrodes can be improved.

According to the methods of fabricating semiconductor devices 100a, 100b, and 100c in accordance with the embodiments of the present inventive concepts, when the holes H are formed to form the storage electrodes 310b, as a part of a side wall of the storage electrode 310b is etched and the etched side wall of the storage electrode 310b is filled with a material such as the upper supporter 220, the upper supporter 220 may be formed to have a large-sized hole and the upper supporter 220 which supports the storage electrode 310b may be reinforced. Therefore, the upper supporter 220 formed between the storage electrodes 310b may be maintained with a predetermined critical dimension (CD). A size of the storage electrode 310b may be reduced, a bridge generated between the storage electrodes 310b may be removed, and thus, electrical characteristics of the semiconductor devices may be improved.

Figure 5:
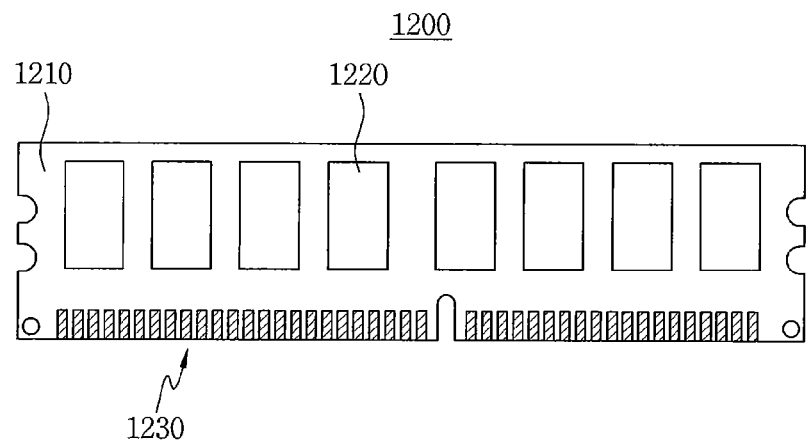
FIG. 5 is a block diagram showing memory modules including semiconductor devices in accordance with the present inventive concepts.

FIG. 5 is a block diagram showing memory modules 1200 including semiconductor devices in accordance with the present inventive concepts.

Referring to FIG. 5, the memory module 1200 may include a module substrate 1210, memory devices 1220 disposed on the module substrate 1210, and terminals 1230 arranged on one side of the module substrate 1210. The module substrate 1210 may include a printed circuit board (PCB). The memory devices 1220 may include semiconductor devices in accordance with the present inventive concepts. The terminals 1230 may include a metal such as copper. Each terminal may be electrically connected to each memory device 1220.

Figure 6:
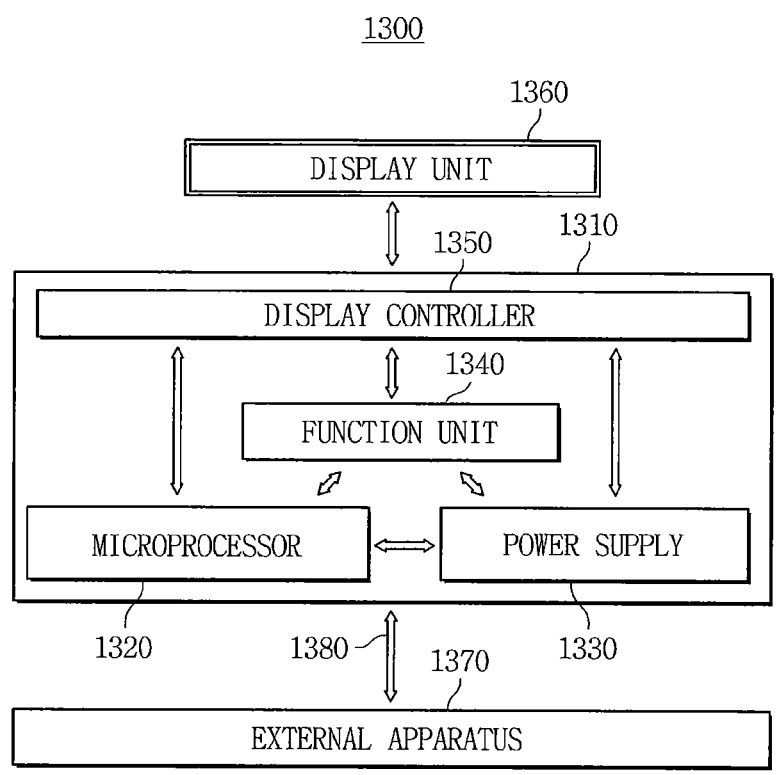
FIGS. 6 and 7 are block diagrams showing electronic systems including semiconductor devices in accordance with the present inventive concepts.
Figure 7:
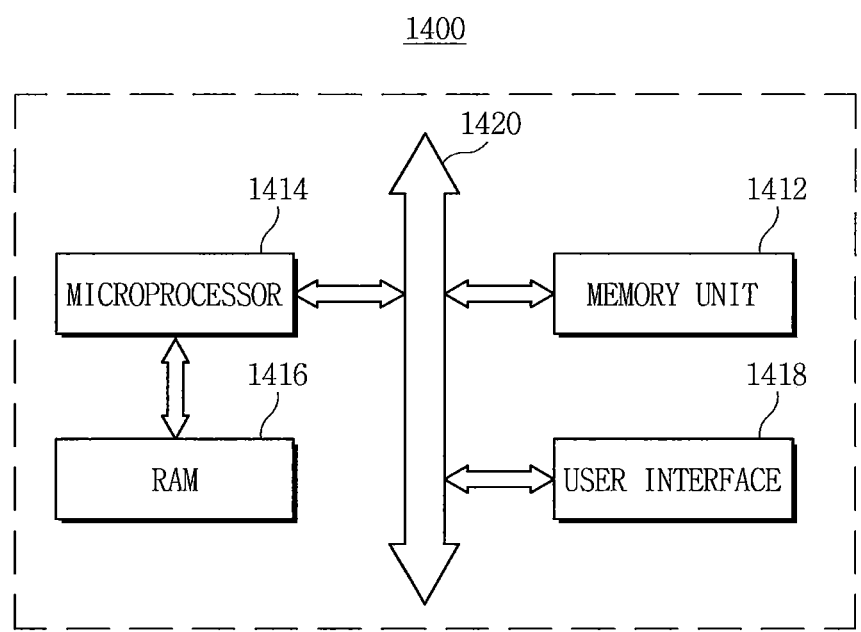

FIGS. 6 and 7 are block diagrams showing electronic systems 1300 and 1400 including a semiconductor device in accordance with the present inventive concepts.

Referring to FIG. 6, the electronic system 1300 may include a body 1310, a display unit 1360, and an external apparatus 1370.

The body 1310 may include a microprocessor 1320, a power supply 1330, a function unit 1340, and/or a display controller 1350. The body 1310 may include a system board or a motherboard having a PCB or the like, and/or a case. The microprocessor 1320, the power supply 1330, the function unit 1340, and the display controller 1350 may be mounted or disposed on an upper surface of the body 1310 or inside the body 1310. The display unit 1360 may be disposed on the upper surface of the body 1310 or inside/outside the body 1310.

The display unit 1360 may display an image processed by the display controller 1350. For example, the display unit 1360 may include a liquid crystal display (LCD), active matrix organic light emitting diodes (AMOLED), or various display panels. The display unit 1360 may include a touch screen. Therefore, the display unit 1360 may have an input/output function.

The power supply 1330 may supply a current or a voltage to the microprocessor 1320, the function unit 1340, the display controller 1350, etc. The power supply 1330 may include a charging battery, a socket for a dry cell, or a voltage/current converter.

The microprocessor 1320 may receive a voltage from the power supply 1330 to control the function unit 1340 and the display unit 1360. For example, the microprocessor 1320 may include a CPU or an application processor (AP).

The function unit 1340 may perform various functions of the electronic system 1300. For example, the function unit 1340 may include a touch pad, a touch screen, a volatile/non-volatile memory, a memory card controller, a camera, a lighting, an audio and moving picture playback processor, a wireless radio antenna, a speaker, a microphone, a USB port, or a unit having other various functions.

The microprocessor 1320 or the function unit 1340 may include semiconductor devices in accordance with the present inventive concepts.

Referring to FIG. 7, electronic systems 1400 may include a microprocessor 1414, a memory unit 1412, and a user interface 1418 configured to perform data communication using a bus 1420. The microprocessor 1414 may include a CPU or an AP. The electronic system 1400 may further include a RAM 1416 in direct communication with the microprocessor 1414. The microprocessor 1414 and/or the RAM 1416 may be assembled within a single package. The user interface 1418 may be used to input data to the electronic system 1400, or output data from the electronic system 1400. For example, the user interface 1418 may include a touch pad, a touch screen, a keyboard, a mouse, a voice detector, a cathode ray tube (CRT) monitor, an LCD, an AMOLED, a plasma display pad (PDP), a printer, a lighting, or various input/output devices. The memory unit 1412 may store operational codes of the microprocessor 1414, data processed by the microprocessor 1414, or data received from the outside. The memory unit 1412 may include a memory controller, a hard disk, or a solid state drive (SSD). The microprocessor 1414, the RAM 1416, and/or the memory unit 1412 may include semiconductor devices in accordance with the present inventive concepts.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the present inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
an interlayer insulating layer on a semiconductor substrate;
contact pads on the semiconductor substrate and penetrating the interlayer insulating layer;
a stopping insulating layer on the interlayer insulating layer;
storage electrodes on the contact pads;
upper supporters between upper parts of the storage electrodes;
side supporters between the storage electrodes and the upper supporters;
lower supporters between the upper supporters and the stopping insulating layer;
a capacitor dielectric layer on the storage electrodes, the side supporters, and the upper supporters;
a storage barrier layer on side surfaces of the storage electrodes; and
a plate electrode on the capacitor dielectric layer,
wherein the capacitor dielectric layer comprises:
a lower capacitor dielectric layer on lower surfaces of the lower supporters, an upper surface of the stopping insulating layer, and the side surfaces of the storage electrodes;

an intermediate capacitor dielectric layer on upper surfaces of the lower supporters, lower surfaces of the upper supporters, and the side surfaces of the storage electrodes; and an upper capacitor dielectric layer on upper surfaces of the storage electrodes, upper surfaces of the side supporters, and upper surfaces of the upper supporters, and wherein an upper surface of the storage barrier layer is coplanar with an upper surface of the intermediate capacitor dielectric layer.

2. The device according to claim 1, wherein the plate electrode comprises:

a lower plate electrode on the lower capacitor dielectric layer;

an intermediate plate electrode on the intermediate capacitor dielectric layer; and an upper plate electrode on the upper capacitor dielectric layer.

3. The device according to claim 1, wherein the upper surfaces of the storage electrodes are coplanar with the upper surfaces of the upper supporters and the upper surfaces of the side supporters.

4. The device according to claim 1, wherein the side supporters are adjacent upper parts of the storage electrodes.

5. The device according to claim 1, wherein the storage barrier layer contacts side surfaces of the intermediate capacitor dielectric layer, side surfaces of the lower supporters, and side surfaces of the lower capacitor dielectric layer.

6. The device according to claim 1, further comprising a capacitor capping layer that comprises SiGe on the plate electrode.

7. A semiconductor device, comprising:

an interlayer insulating layer on a semiconductor substrate;

contact pads on the semiconductor substrate and penetrating the interlayer insulating layer;

storage electrodes on the contact pads;

a storage barrier layer contacting side surfaces of the storage electrodes;

upper supporters between upper parts of the storage electrodes;

lower supporters between intermediate parts of the storage electrodes;

a capacitor dielectric layer on the storage electrodes and the upper supporters; and a plate electrode on the capacitor dielectric layer, wherein the upper supporters contact side surfaces of upper parts of the storage electrodes, and the lower supporters contact side surfaces of the storage barrier layer, and wherein an upper surface of the storage barrier layer is coplanar with lower surfaces of the upper supporters.

8. The device according to claim 7, further comprising a stopping insulating layer on the interlayer insulating layer.

9. The device according to claim 8, wherein the capacitor dielectric layer comprises:

a lower capacitor dielectric layer on an upper surface of the stopping insulating layer, the side surfaces of the storage electrodes, and lower surfaces of the lower supporters;

an intermediate capacitor dielectric layer on upper surfaces of the lower supporters, the side surfaces of the storage electrodes, and the lower surfaces of the upper supporters; and an upper capacitor dielectric layer on upper surfaces of the upper supporters, and upper surfaces of the storage electrodes.

10. The device according to claim 9, wherein the plate electrode comprises:

a lower plate electrode on the lower capacitor dielectric layer;

an intermediate plate electrode on the intermediate capacitor dielectric layer; and an upper plate electrode on the upper capacitor dielectric layer.

11. The device according to claim 9, wherein an upper surface of the intermediate capacitor dielectric layer is coplanar with the lower surfaces of the upper supporters and the upper surface of the storage barrier layer.

12. The device according to claim 9, wherein the storage barrier layer contacts side surfaces of the intermediate capacitor dielectric layer and side surfaces of the lower capacitor dielectric layer.

13. The device according to claim 7, wherein the upper supporters comprise the same material as the lower supporters.

14. The device according to claim 7, wherein the upper supporters comprise a first supporter and a second supporter, and wherein sidewalls of the second supporter are coplanar with sidewalls of the storage barrier layer.

15. The device according to claim 14, wherein an upper surface of the second supporter is coplanar with an upper surface of one of the storage electrodes and an upper surface of the first supporter, and wherein a lower surface of the second supporter is coplanar with a lower surface of the first supporter.

16. The device according to claim 7, wherein the upper surface of the storage barrier layer contacts the lower surfaces of the upper supporters.

17. A semiconductor device, comprising:

a storage electrode;

a plate electrode, wherein the plate electrode comprises an upper plate electrode on the storage electrode and a lower plate electrode adjacent a lower portion of the storage electrode;

an supporter between the lower plate electrode and the upper plate electrode in contact with a side surface of the storage electrode; and a conductive storage barrier layer on the storage electrode, wherein a top surface of the storage barrier layer contacts a lower surface of the supporter, wherein the supporter comprises an upper supporter and a side supporter, and wherein sidewalls of the side supporter are coplanar with sidewalls of the storage barrier layer.

18. The semiconductor device of claim 17, further comprising:

a lower supporter between the upper supporter and the lower plate electrode; and an intermediate plate electrode on the lower supporter and below the upper supporter.

19. The semiconductor device of claim 17, wherein a top surface of the side supporter is coplanar with a top surface of the storage electrode and a top surface of the upper supporter, and wherein a bottom surface of the side supporter is coplanar with a bottom surface of the upper supporter.

20. The semiconductor device of claim 18, further comprising a capacitor dielectric layer surrounding the intermediate plate electrode, wherein a top surface of the capacitor dielectric layer is coplanar with a bottom surface of the side supporter and the top surface of the storage barrier layer.

* * * * *